US006607930B2

(12) United States Patent
Karpov et al.

(10) Patent No.: US 6,607,930 B2
(45) Date of Patent: Aug. 19, 2003

(54) METHOD OF FABRICATING A FIELD EMISSION DEVICE WITH A LATERAL THIN-FILM EDGE EMITTER

(75) Inventors: Leonid Danielovitch Karpov, Austin, TX (US); Mark F. Eaton, Austin, TX (US)

(73) Assignee: Stellar Display Corporation, Austin, TX (US)

( * ) Notice: Subject to any disclaimer, the term of this patent is extended or adjusted under 35 U.S.C. 154(b) by 0 days.

(21) Appl. No.: 10/072,441

(22) Filed: Feb. 5, 2002

(65) Prior Publication Data

US 2002/0146853 A1 Oct. 10, 2002

Related U.S. Application Data

(63) Continuation-in-part of application No. 09/699,235, filed on Oct. 26, 2000, now abandoned.

(60) Provisional application No. 60/161,538, filed on Oct. 26, 1999.

(51) Int. Cl.[7] ................................................ H01L 21/00

(52) U.S. Cl. .......................... 438/20; 438/105; 438/670

(58) Field of Search ............................ 438/20, 28, 105, 438/670, 931, 951

(56) References Cited

U.S. PATENT DOCUMENTS

| | | | | | |
|---|---|---|---|---|---|
| 5,266,155 | A | * | 11/1993 | Gray | 438/20 |
| 5,647,998 | A | * | 7/1997 | Potter | 438/105 |
| 5,866,438 | A | * | 2/1999 | Itoh et al. | 438/20 |
| 6,033,924 | A | * | 3/2000 | Pack et al. | 438/20 |

* cited by examiner

*Primary Examiner*—Chandra Chaudhari

(57) ABSTRACT

A method for fabricating a thin-film edge emitter device includes the steps of providing a first conductive layer having a top surface; providing an insulating layer having a top surface disposed above the top surface of the first conductive layer; providing a second conductive layer on the insulating layer; and providing a well in the insulating layer over the first conductive layer and an edge in the second conductive layer proximate the well. Providing the well and the edge includes processing the first conductive, insulating, and second conductive layers by at least one of lift-off processing, photolithography processing, and processing with the use of a pre-formed insulating layer having at least one opening associated with a location of the well. The first conductive layer forms an anode. Lastly, the second conductive layer forms at least one of a cladded cathode having an emissive edge and a control electrode.

66 Claims, 18 Drawing Sheets

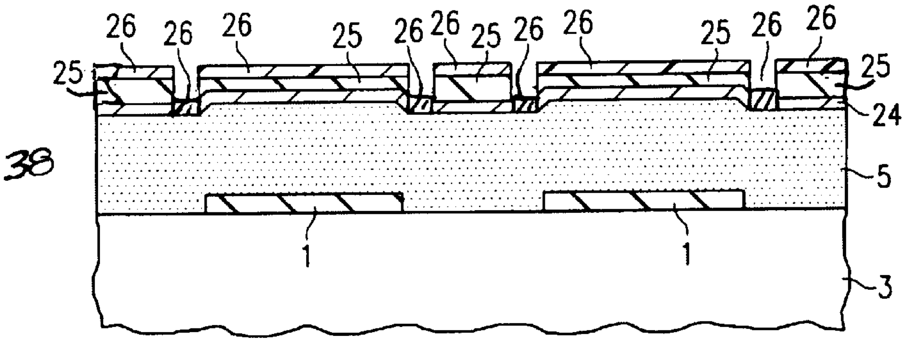
FIG. 38
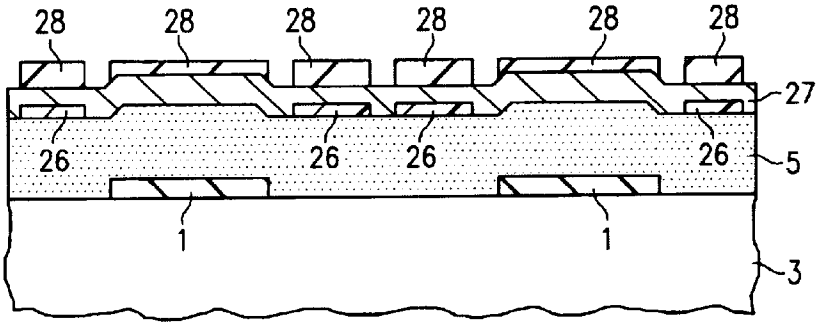
FIG. 39
FIG. 40
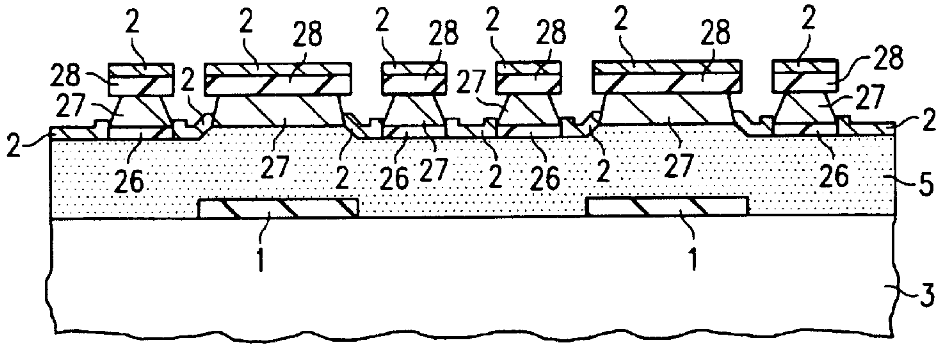
FIG. 41
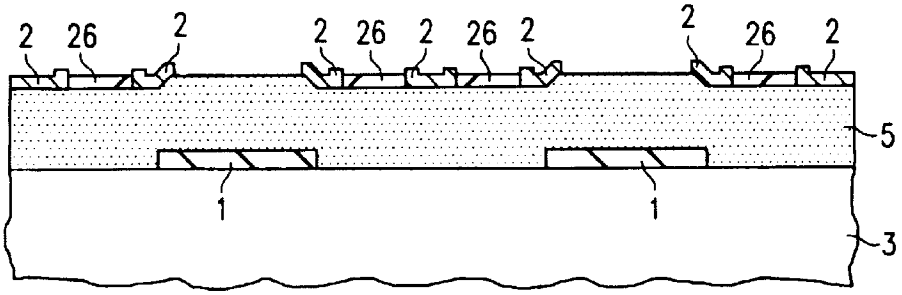

FIG. 52
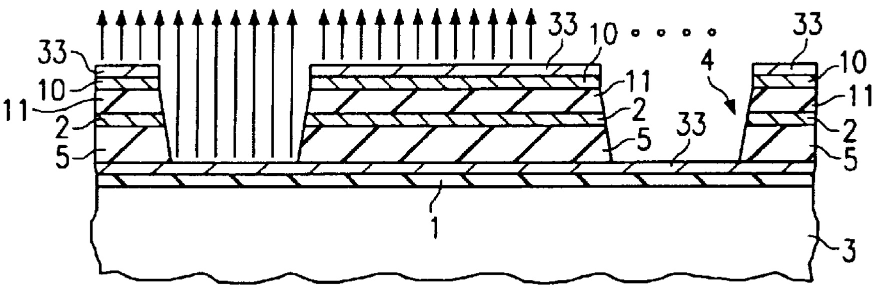
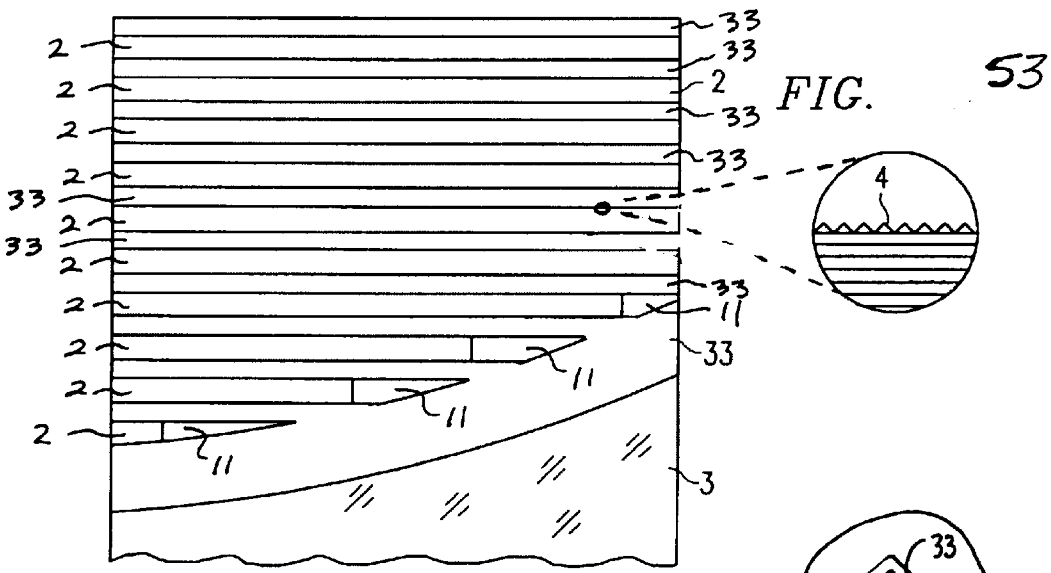
FIG. 53
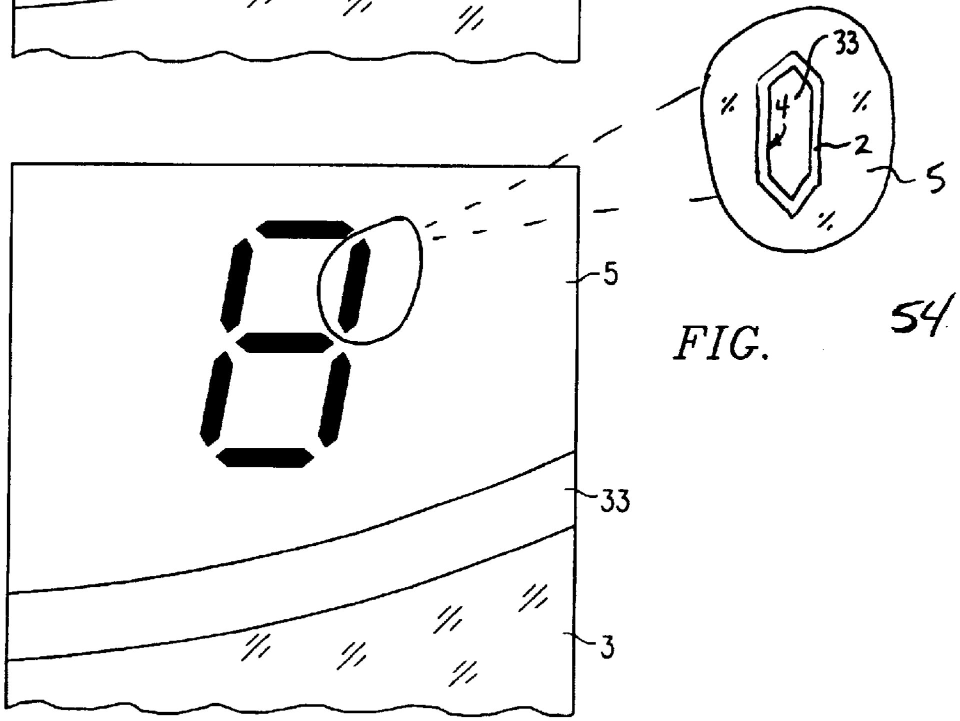
FIG. 54

METHOD OF FABRICATING A FIELD EMISSION DEVICE WITH A LATERAL THIN-FILM EDGE EMITTER

CLAIM FOR PRIORITY

This application is a continuation in part of application Ser. No. 09/699,235, now abandoned, filed Oct. 26, 2000, entitled "METHOD OF FABRICATING A FIELD EMISSION DEVICE WITH A LATERAL THIN-FILM EDGE EMITTER, which claims priority under 35 U.S.C. §119(e) to provisional application No. 60/161,538, filed Oct. 26, 1999, entitled "CONFIGURABLE COLD CATHODES USING EDGE EMITTERS", both of which are fully incorporated herein by reference.

BACKGROUND

1. Field of the Invention

This invention relates generally to the field of vacuum microelectronic devices and, more particularly, to a method of fabrication of a field emission device with a lateral thin-film edge emitter.

2. Description of the Related Art

Recently, interest has grown in using cold cathode sources, including those based on field emission principles, to supply electrons in a variety of devices, particularly display devices. The electron guns or filaments currently used as thermionic cathodes in such display devices as cathode ray tubes, flood cathode ray tubes or vacuum fluorescent displays present a number of limitations and drawbacks. These include the generation of heat which not only wastes energy but can adversely affect the operation or lifetime of the device, non-uniformities in the emission current, the need for separate grid structures, and difficulties in placing a thermionic cathode source in the display device for assembly.

Various cold cathodes have been investigated as replacements for thermionic cathodes, but they also suffer limitations as well. Microtip emitter structures, sometimes known as Spindt cathodes, have been extensively researched, but they are costly to fabricate and the tips are subject to degradation in operation. Surface emitters, such as those using negative electron affinity materials, have been proposed, but they have been unable to achieve the emission uniformity needed for display applications.

More recently, carbon nanotubes have been researched and while they exhibit good emission performance, the processes used thus far involved forming the nanotubes through a carbon arc discharge process, precisely slicing the nanotubes, standing them on end, and attaching them with a vertical orientation to a plate. This process has proven to be cumbersome and expensive.

Avalanche cold cathodes have also been researched but these rely on silicon semiconductor manufacturing processes that add cost to the cathodes.

Accordingly, it would be desirable to provide a method of fabricating a field emission device to overcome the above mentioned problems.

SUMMARY

A method for fabricating a thin-film edge emitter device includes the steps of providing a first conductive layer having a top surface; providing an insulating layer having a top surface disposed above the top surface of the first conductive layer; providing a second conductive layer on the insulating layer; and providing a well in the insulating layer over the first conductive layer and an edge in the second conductive layer proximate the well. Providing the well and the edge includes processing the first conductive, insulating, and second conductive layers by at least one of lift-off processing, photolithography processing, and processing with the use of a pre-formed insulating layer having at least one opening associated with a location of the well. The first conductive layer forms an anode. The second conductive layer forms at least one of a cladded cathode having an emissive edge and a control electrode.

BRIEF DESCRIPTION OF THE DRAWINGS

FIGS. 36–43 illustrate a process according to further embodiments including the forming of a cathode layer with a lateral resistor using direct photolithography and lift-off processing;

FIG. 52 illustrates a field emission device produced by the method of the present disclosure according to another embodiment, the method including depositing a secondary electron emission layer on the anode layer and on an uppermost surface of the device;

FIG. 53 illustrates a top view of a field emission device formed by the method of the present disclosure according to another embodiment, including lift-off processing with the use of lift-off pillars shaped in the form of long strips;

FIG. 54 illustrates a top view of a field emission device formed by the method of the present disclosure according to another embodiment, including lift-off processing with the use of lift-off pillars patterned in a shape suitable for use in a character/segmented display;

DETAILED DESCRIPTION

Figure 1:
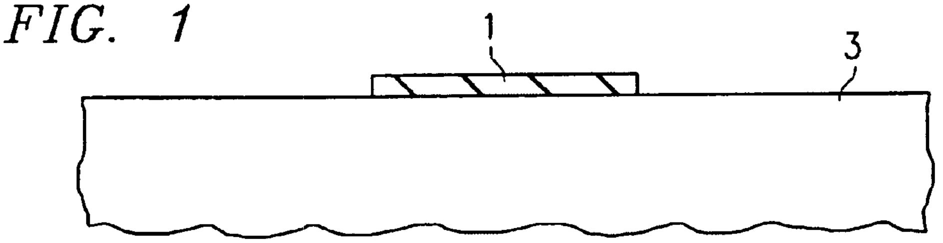
FIGS. 1–7 illustrate steps of a process for forming a field emission device according to one embodiment, including lift-off processing.

Reference will now be made to the drawing figures in connection with the following discussion directed to the method of making a field emission device according to various embodiments. Similar reference numbers are used in the drawings to refer to the same or like parts.

Referring now to FIGS. 1 through 7, the method of fabricating a field emission device according to one embodiment herein includes lift-off processing. The method begins by providing a substrate (3) having a conductive layer disposed on a surface thereof. The conductive layer is patterned to serve as an anode (1) (FIG. 1).

Figure 2:
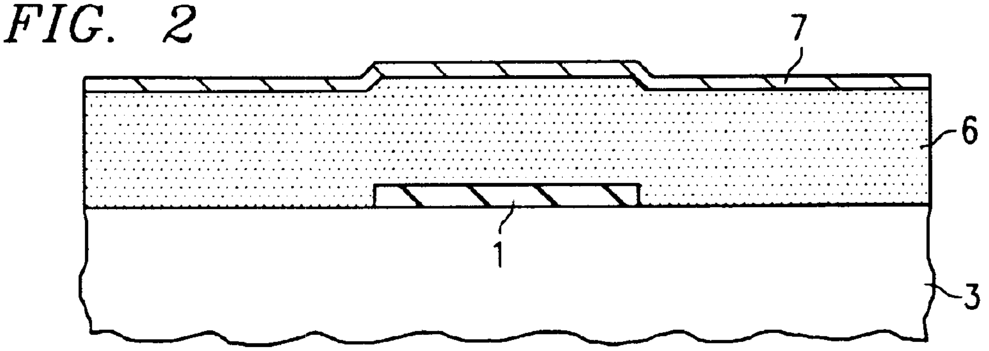
Figure 3:
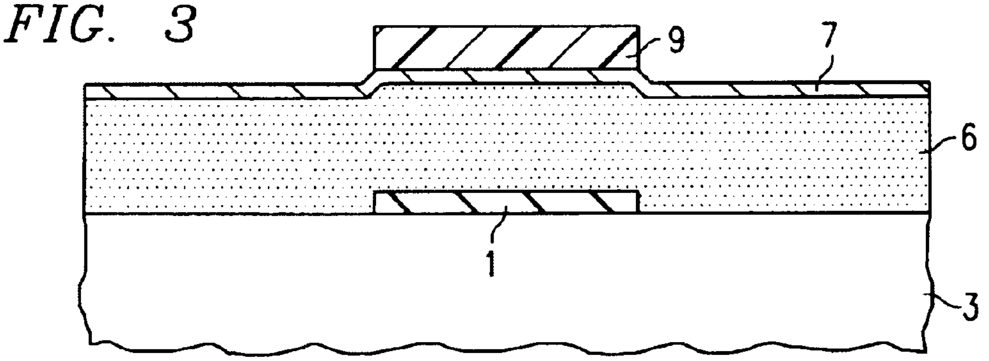
Figure 4:
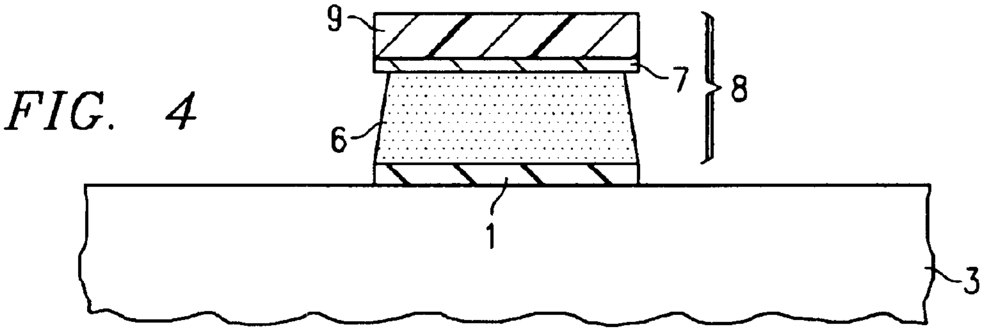

Subsequently, two layers of different materials, one a lift-off material (6) and the other a lift-off cap material (7) are deposited on the surface of substrate (3) and the conductive layer (1). The two layers (6,7) are substantially parallel to the substrate (3) (FIG. 2). A photoresist mask (9) is patterned onto layer (7) above anode (1) (FIG. 3). Lithography and etching are used to form a pillar (8) (FIG. 4) from the two layers (6,7) and photoresist mask (9). The etching includes undercutting of the lower layer (6) from the upper layer (7) of liftoff pillar (8) (FIG. 4).

Figure 5:
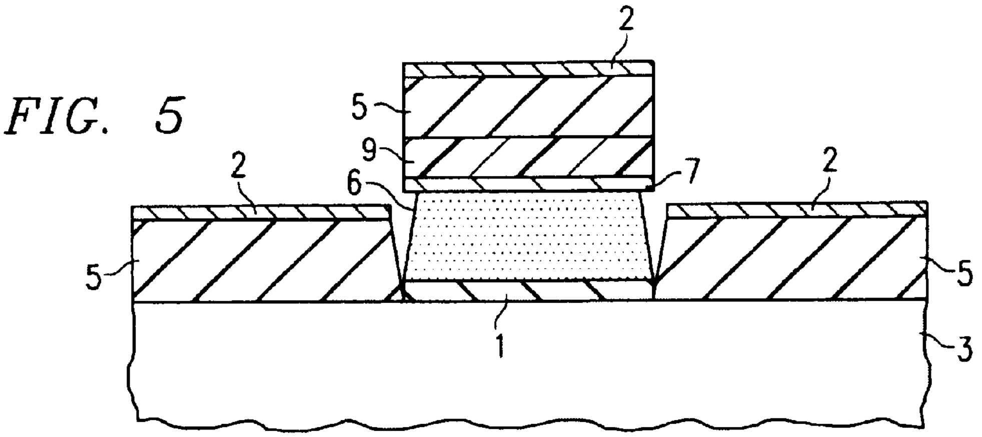

A first insulating layer (5) and a cathode layer (2) are deposited over the surface of the substrate (3), including the lift-off pillar (8) and mask (9)(FIG. 5). The thickness of the first insulating layer (5) and cathode layer (2) are preferably made no greater than the thickness of lift-off pillar (8) and the photoresist mask (9).

Figure 6:
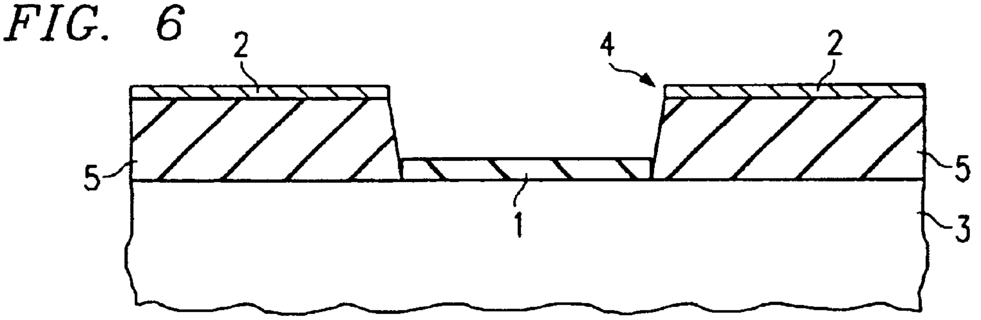

Lift-off pillar (8) is then removed by etching. Removing lift-off pillar (8) creates an opening in the cathode and first insulating layers, 2 and 5, respectively. Creating the opening also forms a cathode edge (4) exposed to the opening (FIG. 6). Following removal of the lift-off pillar (8), the method further includes etching the insulating layer (5) to produce a desired undercut from the cathode layer (2).

Figure 7:
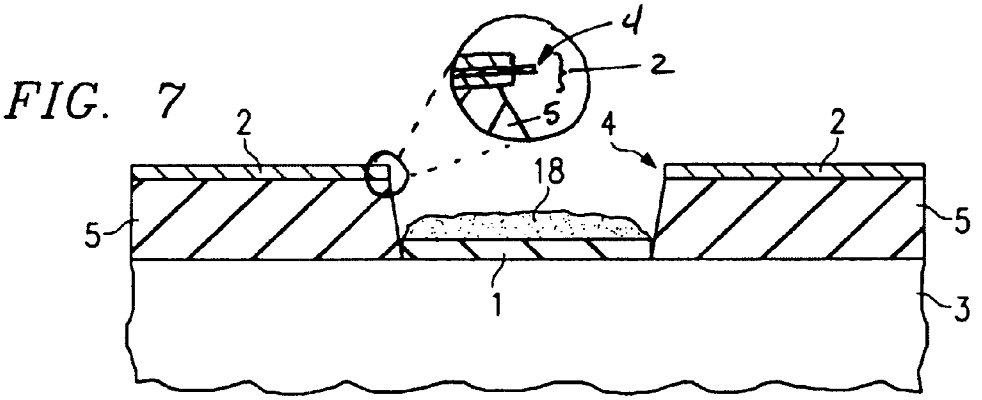

In FIG. 7, the method includes depositing a phosphor layer (18) into the opening and onto a surface of anode layer (1) such that the top of the phosphor layer (18) is below the level of the edge (4) of cathode layer (2). In addition, the phosphor (18) does not contact cathode layer (2). FIG. 7 illustrates a cross-sectional view of a field emission device fabricated according to one embodiment of the present disclosure.

According to another embodiment, anode layer (1) can comprise at least one of patterned sheets, strips, and other patterns of reflective metal. Examples of such reflective metal include at least one of chrome and aluminum. During device operation, cathode layer (2) emits electrons at edge (4) and anode layer (1) collects the emitted electrons. In addition, the reflective metal of anode layer (1) reflects light from the phosphor material of the field emission device and produces a measure of extra brightness, as compared to an anode layer of a non-reflective metal. Anode strips can be patterned by photolithography and etching, by mask deposition or by any other suitable process.

Substrate (3) includes any suitable substrate, such as one selected from at least glass, ceramic and any other substrate material compatible with processing temperatures. For an application of the field emissive device in a sealed display, the processing temperatures could include temperatures on the order of approximately 450° C.

Lift-off pillar (8) may include any materials suitable for preferential etching with regard to other materials on the substrate, up to the step of removing lift-off pillar (8), as shown in FIG. 6. For example, lift-off pillar (8) may include copper (6) with a chrome cap (7). The lift-off pillar and/or the lift-off cap may also be patterned in any desired configuration, wherein the patterned configuration defines a configuration of the cathode edge (4), as will be discussed further herein.

First insulating layer (5) can include any material capable of withstanding the high electric field characterizing the operation of the device. Exemplary materials include SiO and $SiO_2$ deposited by evaporation or some other suitable method. Exemplary materials can also include aero gels, spin-on glass materials, tape-on dielectrics, and various polymer dielectrics. The polymer dielectrics may also be spun on to the substrate.

In one embodiment, the first insulating layer (5) has a thickness on the order of between 2 $\mu$m and 10 $\mu$m. In other embodiments, the first insulating layer (5) has a thickness on the order of 10 $\mu$m or more. In the case of SiO or $SiO_2$, the method may include adding very small amounts of a polymerizing agent during the deposition process for obtaining a thicker layer.

Cathode layer (2) may have a thickness on the order of several tens to several thousands of Angstroms (e.g., on the order of approximately (0.001–0.003 $\mu$m) to (0.1–0.3) $\mu$m. Cathode layer (2) may include any material known to emit under application of a high electric field, or any combination of such materials. For example, cathode layer (2) may include negative electron affinity materials including at least one of diamond, diamond-like carbon, carbon nanotubes, and various nitrides. In one embodiment, the method includes patterning the anode layer and the cathode layer into strips, wherein the cathode layer strips are made perpendicular to the anode layer strips.

Figure 8:
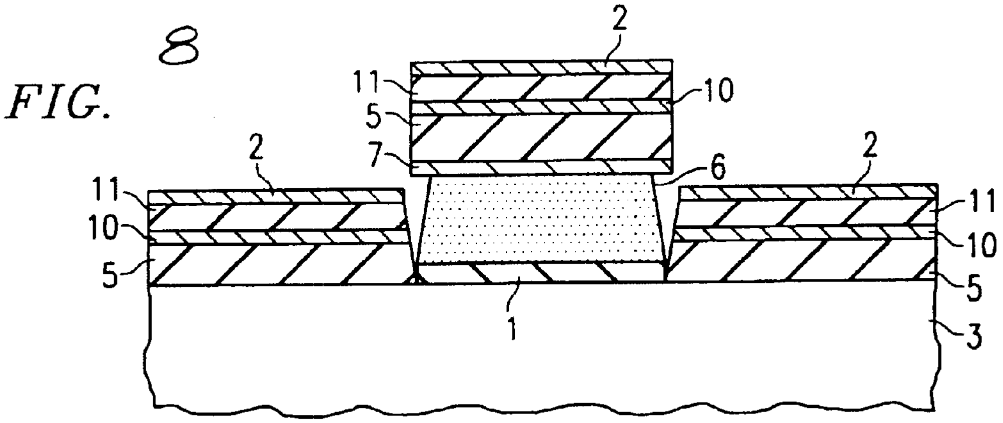
FIGS. 8–9 illustrate steps of a process for forming a field emission device according to another embodiment, including lift-off processing.
Figure 9:
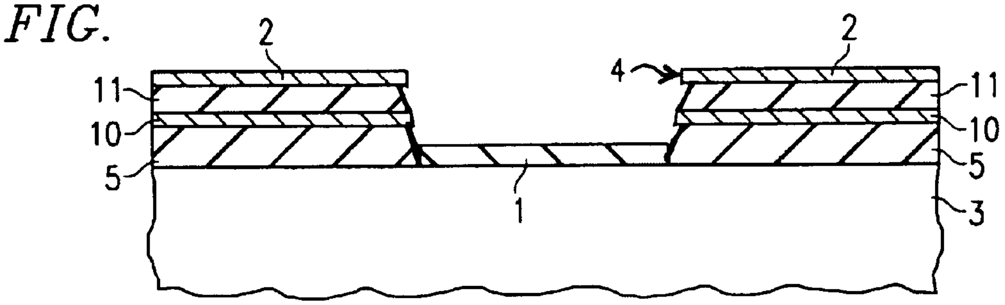

With reference now to FIGS. 8 and 9, according to another embodiment of the method of the present disclosure, a first insulating layer (5) is deposited on the substrate (3), covering the lift-off pillar (8) and anode layer (1). Next, a first conductive layer (10) is provided upon first insulating layer (5). First conductive layer (10) forms a control electrode, as discussed further herein. A second insulating layer (11) is then disposed upon conductive layer (10), followed by deposition of cathode layer (2). The lift-off pillar (8) is then removed by etching. In addition, subsequent to removal of lift-off pillar (8), etching may be continued to produce a desired undercut in insulating layers (5) and (11).

Figure 10:
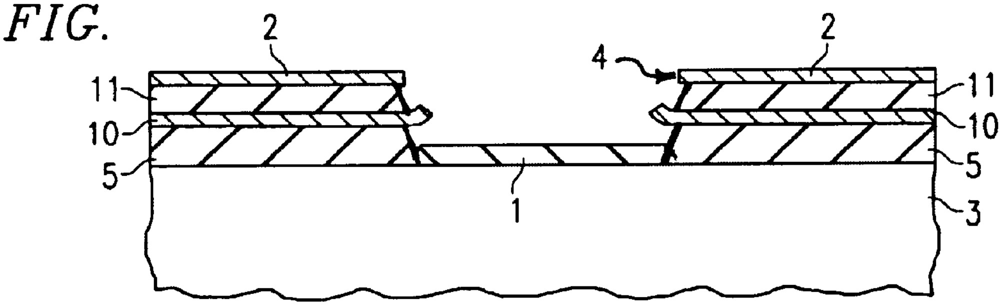
FIGS. 10–11 illustrate additional steps of a process for forming a field emission device according to another embodiment.

FIG. 10 illustrates a cross-sectional view of a field emission device produced by the method according to another embodiment of the present disclosure. In particular, the method includes bending a protruding edge of one of the conductive layers towards the edge of the other conductive layer.

For example, FIG. 10 shows a protruding edge of conductive layer (10) bent towards the protruding edge of cathode layer (2). The bending allows closer spacing of the two electrodes. This is useful for lowering a control voltage of the field emission device in the case of a triode, while maintaining the second insulating layer (11) at a thickness sufficient to withstand a high electric field and avoid dielectric breakdown.

With reference still to FIG. 10, according to one embodiment of the method of the present disclosure, conductive layer (10) is formed of two conductive materials, a lower level material having a coefficient of linear expansion higher than that of the upper level material. Accordingly, conductive layer (10) is caused to bend by its formation through deposition of the two conductive materials and thermal processing.

Figure 11:
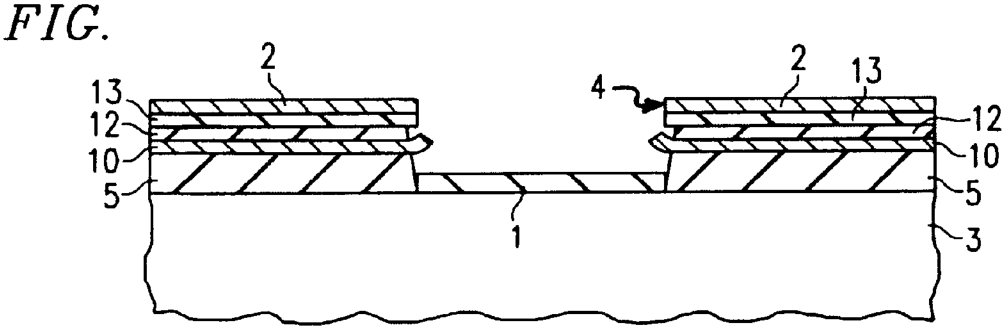

A further embodiment of the method of the present disclosure shall now be described with reference to FIG. 11. The method includes providing second insulating layer (11) as comprised of two different materials. That is, second insulating layer (11) includes a lower material layer (12) and an upper material layer (13). Lower material layer (12) is selected for its greater rate of etching compared to an etching rate of upper material layer (13). For example, lower material layer (12) may include $SiO_2$ and upper material layer (13) may include $AlO_3$.

Subsequent to formation of second insulating layer (11) comprised of lower material layer (12) and upper material layer (13), cathode layer (2) is deposited on the surface of the second insulating layer (11). The method further includes etching to remove lift-off pillar (8). Subsequent to removal of lift-off pillar (8), second insulating layer (11) is then further etched until a sufficient amount of lower material layer (12) is removed to allow a protruding edge of conductive layer (10) to bend towards, and perhaps just touch, upper material layer (13).

In the embodiments of the present disclosure, cathode layer (2) of the field emission device may comprise at least one of any material known to emit electrons under high electric field and any combination of several layers of material, one or more of which will emit electrons under high electric field. An exemplary cathode layer having one or more layers of which will emit electrons under high electric field includes a cladded cathode of metal-carbon-metal. In such a cladded cathode, the metal provides mechanical strength and conductivity for one or more very thin layers of emitting carbon material. The metal may include, for example, chrome.

In a preferred embodiment, cathode layer (2) comprises a cladded cathode layer. With the cladded cathode layer, the method further includes, following the removal of the lift-off pillar (8), etching the edge (4) of cladded cathode layer (2) to expose a thin edge of carbon of the cladded cathode. The thin edge of carbon results from its protrusion slightly beyond the metal layer of the cladded cathode after etching. Accordingly, the thin edge of carbon protrudes into the window-like opening or well of the field emission device. In one embodiment, the thin carbon edge of the cladded cathode may be on the order of 100 Angstroms to 1,000 Angstroms in thickness. In another embodiment, the thin carbon edge may be on the order of 1,000 Angstroms or more in thickness.

The method of depositing carbon during formation of the cladded cathode layer includes at least one of carbon arc deposition and any other carbon deposition method, such as phase vapor deposition (PVD), chemical vapor deposition (CVD), or laser ablation. Additionally, to enhance deposition uniformity, multiple sets of carbon rods may be provided in a deposition chamber during carbon deposition. Small amounts of gas may also be introduced into the deposition chamber so as to stimulate the formation of carbon nanotubes.

A further embodiment of the method of the present disclosure includes the formation of cathode layer (2) by the steps of depositing metal, depositing carbon or another emitting material, depositing metal again. The method further includes preferentially etching away the metal at the cathode layer edge by electrochemical or other means.

A still further embodiment of the cathode layer formation includes formation of the cladded cathode and its respective edge (4) by the steps of depositing metal, depositing at the same time both metal and carbon, depositing carbon, depositing again at the same time both metal and carbon, and finally depositing metal alone. The method further includes preferentially etching the cathode edge. When etched, the cladded cathode layer composition reveals a rough surface of carbon points above and below the central thin edge of carbon at the emitting edge. The surface roughness at the emitting edge further increases the coefficient of enhancement of electric field in the device.

According to another embodiment, the method includes depositing small particles of a material having negative electron affinity, such as diamond, onto cathode edge (4). The small particles have a size on the order of approximately 30–60 Å. One method for depositing the small particles of material having negative electron affinity includes electrophoretic deposition while supplying a voltage between the anode (1) and cathode (2). Subsequent to the electrophoretic deposition, the method further includes thermally treating the device at a temperature on the order of between 300° C. and 650° C. for a prescribed duration.

The embodiments of the present disclosure further include various other techniques for fabricating cathodes having superior emission performance for respective field emission devices. Referring now to FIGS. 7A through 11, according to another embodiment, the method includes fabricating comb-shaped emitters for a field emission device. The method may also be used for forming tooth-shaped emitters, in a similar manner.

Figure 12:
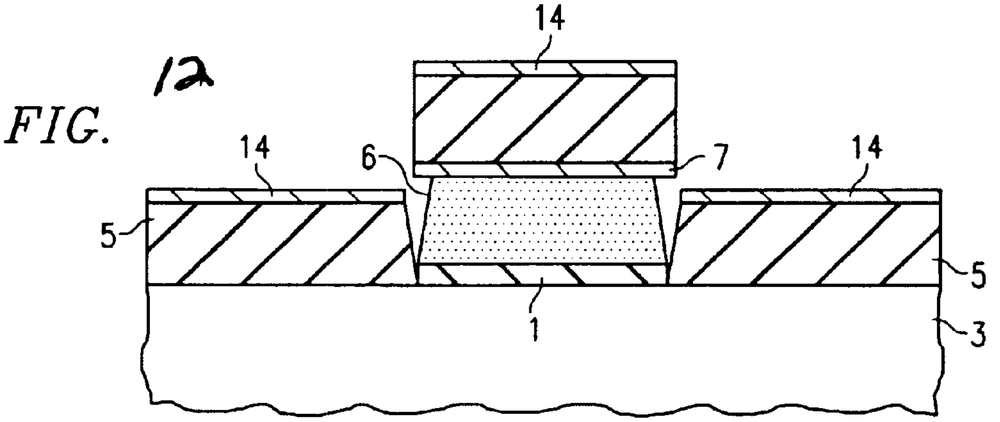
FIGS. 12–16 illustrate steps of a process for forming a field emission device having a comb-shaped cathode according to another embodiment of the present disclosure, including lift-off processing.

The embodiment of FIGS. 12–16 includes the steps of forming anode layer (1) and lift-off pillar (8) as discussed herein above. The method further includes the following steps. A first insulating layer (5) is deposited on the substrate (3), including on lift-off pillar (8). A layer of masking material (14), for example aluminum (Al), is deposited on the surface of first insulating layer (5), as shown in FIG. 12.

Figure 13:
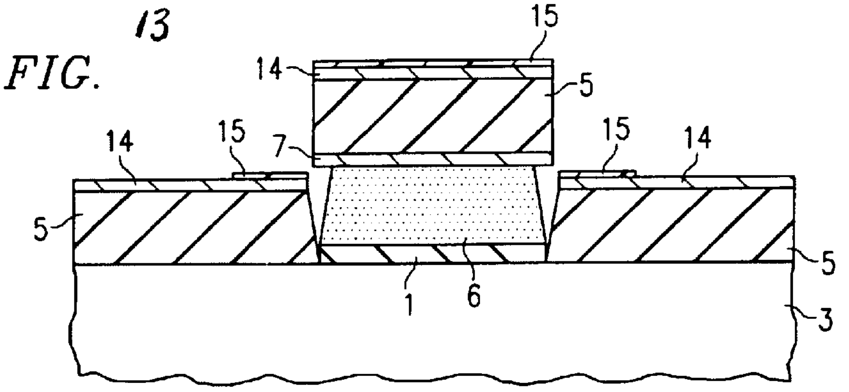
Figure 14:
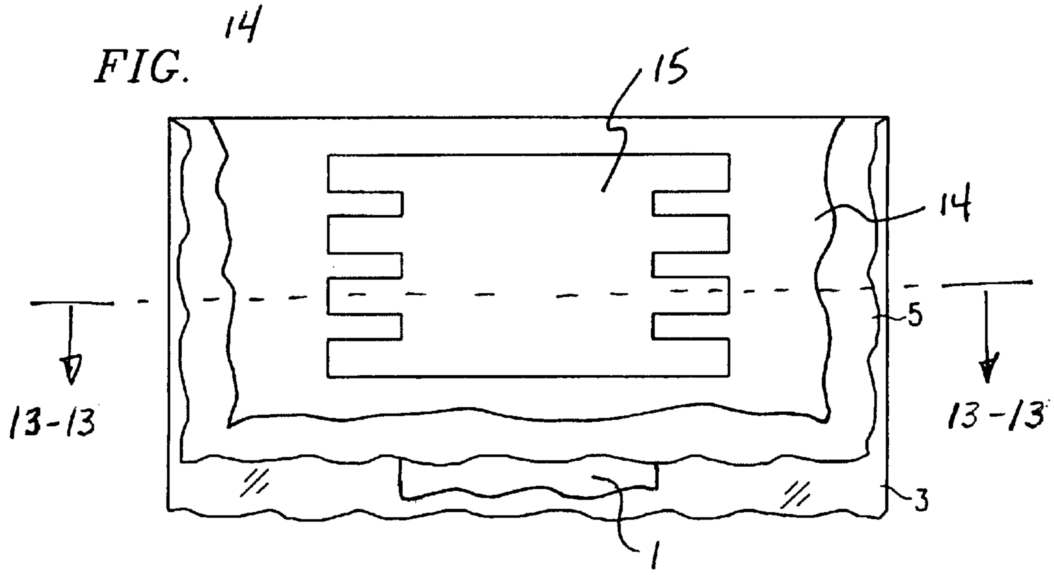

In FIG. 13, a photoresist mask (15) is formed on the surface of the masking material (14). In particular, the photoresist mask covers the top of lift-off pillar (8), and is further formed with a comb shape around at least one side edge external to the lift-off pillar (8). A side view of the device having photoresist mask (15) is shown in FIG. 13 and a top view of the same, further showing the comb shapes, in shown in FIG. 14.

Subsequent to forming of photoresist mask (15), the method includes etching masking layer (14) through photoresist mask (15). Etching of masking layer (14) exposes the first insulating layer (5) in areas not covered by photoresist mask (15).

Figure 15:
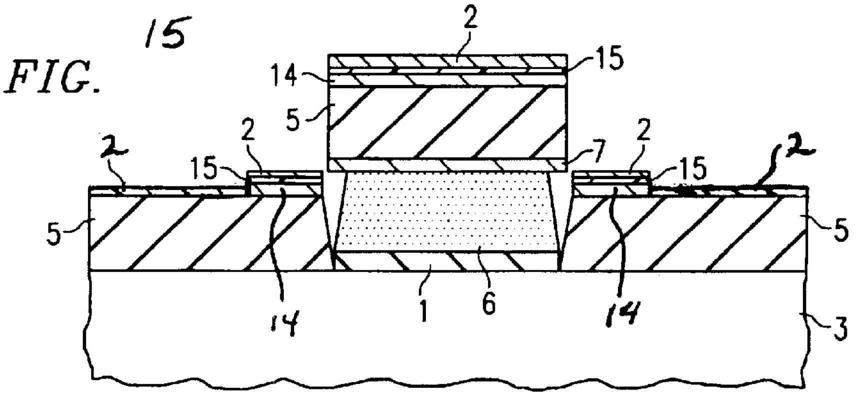

Subsequent to the etching of masking layer (14), the method further includes depositing material to form cathode layer (2). In one embodiment, cathode layer (2) can include a cladded cathode layer, as previously discussed. The cathode layer (2) is normal to the surface of photoresist mask (15) and the exposed surface of first insulating layer (5), as shown in FIG. 15.

In a next step, the method includes removing together the photoresist mask (15), masking material (14), and a respective portion of the cathode layer (2) that coats the surface of the photoresist mask (15), by etching. The etching step exposes the part of first insulating layer (5) around lift-off pillar (8) that was previously covered by the comb-shape pattern of the photoresist mask (15). In addition, the etching step forms an opposite comb-shaped pattern in the cathode layer (2), proximate the external side edges of the liftoff pillar (8).

Figure 16:
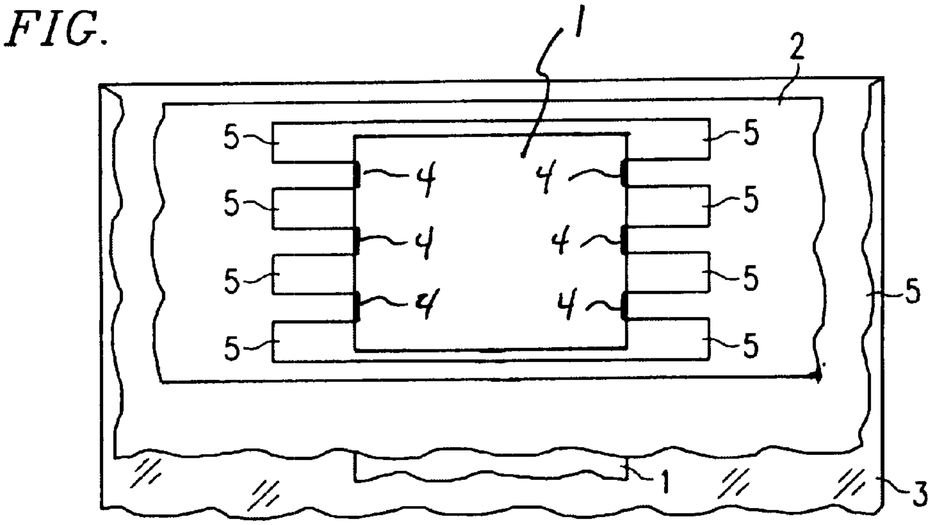

The method next includes removing lift-off pillar (8) to create an opening in the first insulating layer (5). Removing the lift-off pillar (8) exposes a portion of anode layer (1), as shown in FIG. 16. In other words, the opening in the first insulating layer (5) and cathode layer (2) forms a well above the exposed portion of anode layer (1).

The method further includes undercutting first insulating layer (5) by etching under an edge (4) of cathode layer (2) around the opening in insulating layer (5). Etching the insulating layer (5) produces a desired undercut from the cathode layer (2).

Upon formation of the opening and undercutting of the insulating layer (5), the method may further include depositing a phosphor layer (18) in the well formed by the opening in the insulating layer (5) and cathode layer (2). The phosphor layer is deposited on the exposed surface of anode layer (1) inside the well.

It may also be desirable to fabricate a field emission device having comb-shape emitters that include lateral resistors to stabilize an emission current of the device. Referring now to FIGS. 17 through 25, the method of fabricating a field emission device according to another embodiment of the present disclosure shall be described.

The method of fabricating comb-shaped emitters with resistors incorporates various above-mentioned steps, including forming anode layer (1) and lift-off pillar (8), as shown and discussed above with reference to FIGS. 1 through 4. The method further includes the following steps.

Figure 17:
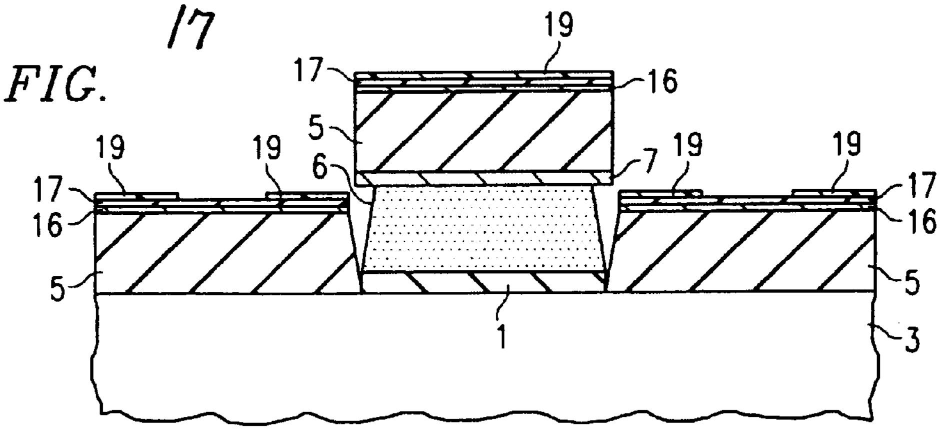
FIGS. 17–25 illustrate steps of a process for forming a field emission device having a comb-shaped cathode with resistors, including lift-off processing.

A first insulating layer (5) is deposited over the surface of the substrate (3), including the lift-off pillar (8) (FIG. 17). The thickness of the first insulating layer (5) is preferably made no greater than the thickness of lift-off pillar (8).

Subsequent to deposition of first insulating layer (5), first and second masking layers (16) and (17) are deposited on the surface of first insulating layer (5). Masking materials may include, for example, molybdenum (Mo) as the first masking layer (16) and aluminum (Al) as the second masking layer (17), as shown in FIG. 17.

A photoresist mask (19) is then formed on the surface of upper masking layer (17). The photoresist mask (19) is made to have rectangular openings placed at a distance from lift-off pillar (8). More particularly, the rectangular openings are located in respective regions for subsequent deposition of resistive material to become the desired emitter resistors.

Figure 18:
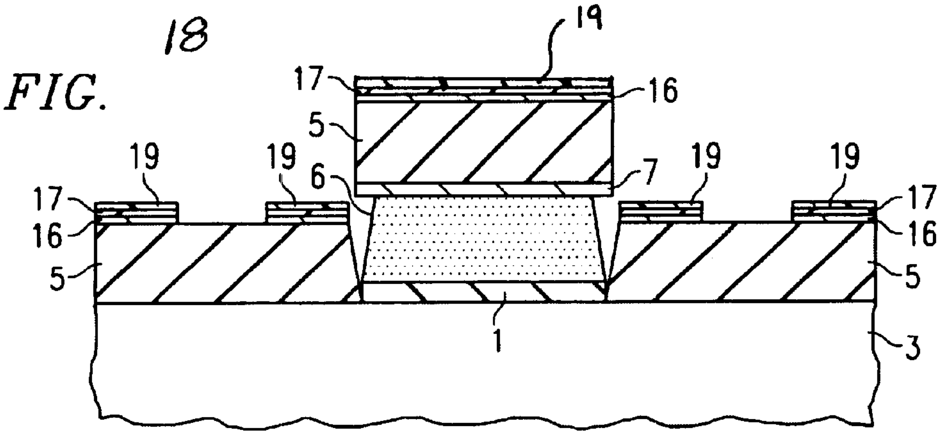

The method further includes etching the two masking layers (16,17) through the openings in the photoresist mask (19). This etching step exposes portions of the insulating layer (5) in the regions corresponding to the openings in the photoresist mask (19), as shown in FIG. 18.

Figure 19:
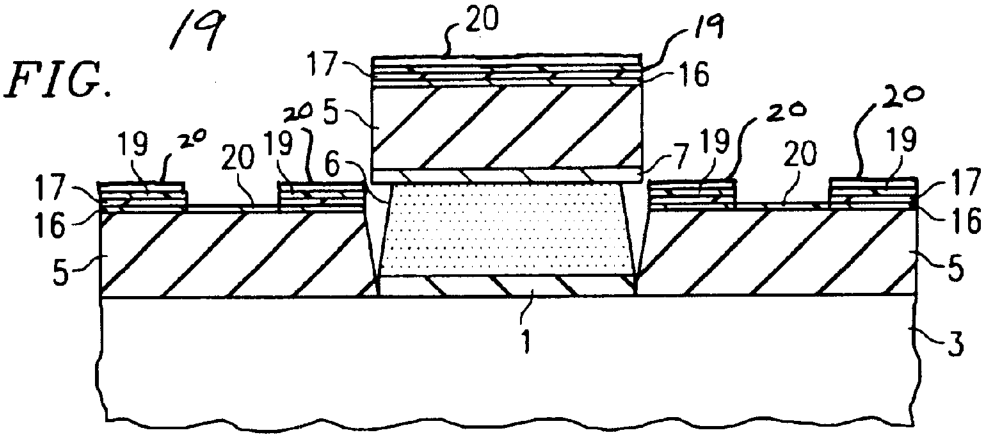
Figure 20:
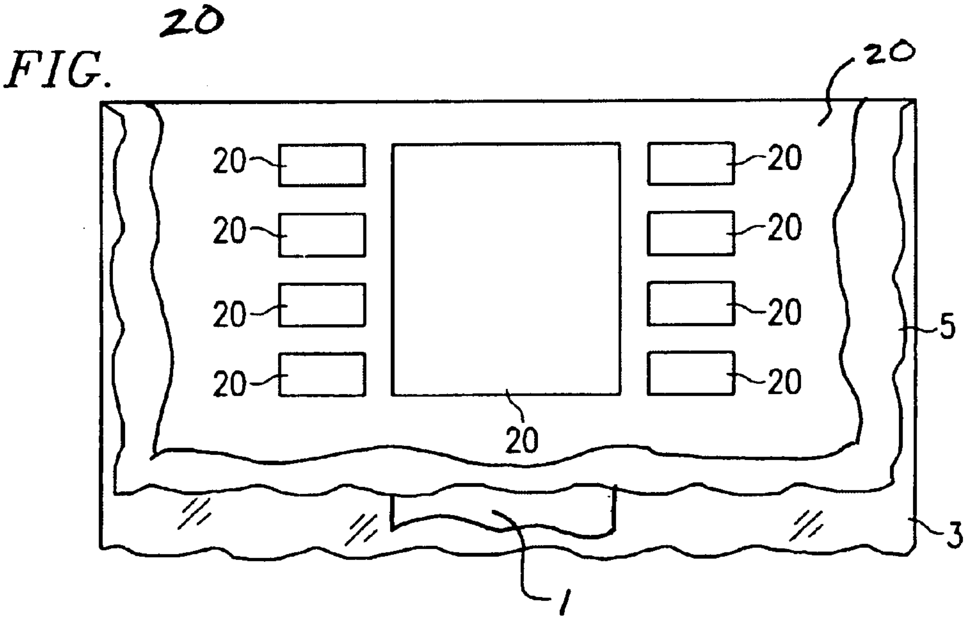

Subsequent to exposing desired regions of insulating layer (5), a resistive layer (20) is deposited on the surface of photoresist mask (19) and on the portions of insulating layer (5) exposed by etching the two masking layers, as shown in FIG. 19. Resistive layer (20) may include, silicon carbide (SiC), for example. Resistive layer (20) may also include at least one of high resistance diamond, amorphous Si, TaN, TiN and other materials with resistance on the order of $10^5$–$10^9$ ohms/square. A top view of the structure subsequent to deposition of resistive layer (20) is shown in FIG. 20.

Figure 21:
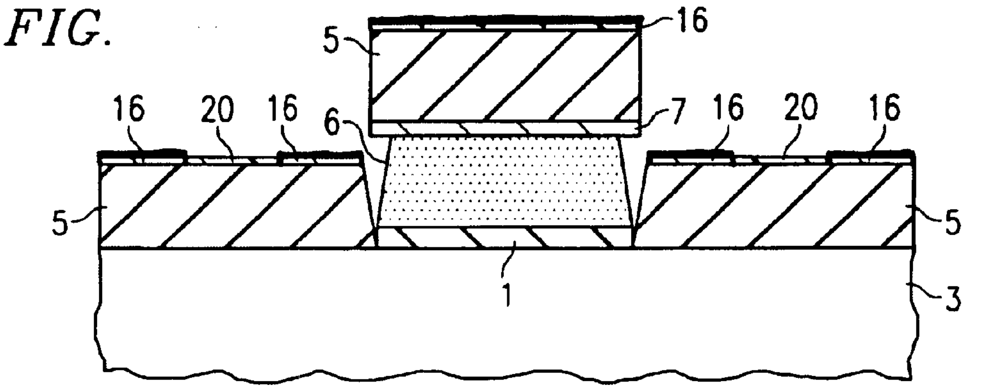

Subsequent to deposition of resistive layer (20), the method includes removing photoresist mask (19) and upper masking layer (17) via etching. The etching step also removes that portion of resistive layer (20) which coats the photoresist mask (19). A cross-sectional view of the resulting structure is shown in FIG. 21.

Figure 22:
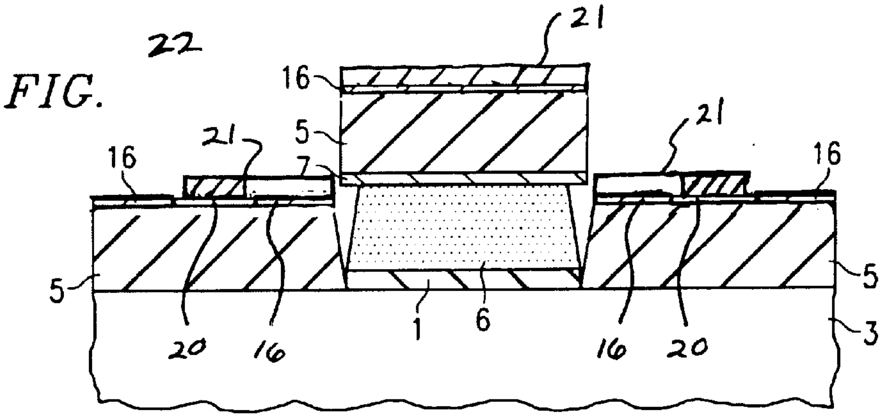
Figure 23:
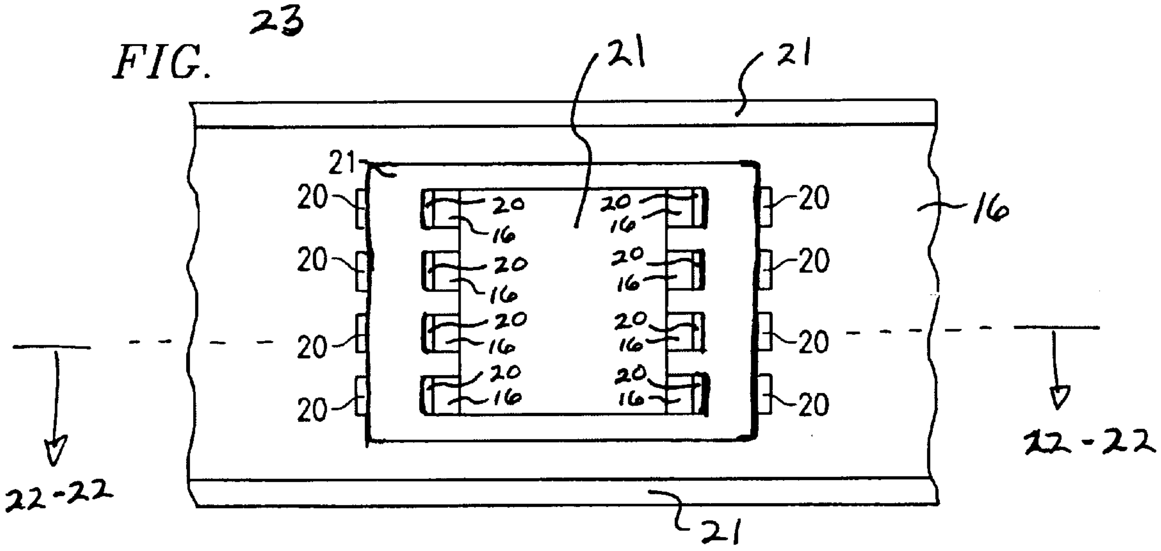

The method further includes forming a second photoresist mask (21) on a surface of the lower masking layer (16), lateral resistors (20), and lift-off pillar (8). More particularly, the second photoresist mask (21) is patterned to cover lift-off pillar (8) and a region of lower masking layer (16) and lateral resistors (20) around a perimeter of lift-off pillar (8). In the region around the perimeter of lift-off pillar (8), end portions of lateral resistors (20), distal from lift-off pillar (8), remain uncovered, as well as distal portions of lower masking layer (16). In addition, rectangular openings are provided in the photoresist mask (21) between an end of each lateral resistor (20) proximate the lift-off pillar (8) and corresponding portions of lift-off pillar (8), including corresponding portions of lower masking layer (16) extending between the proximate end of each lateral resistor (20) and lift-off pillar (8). The openings in photoresist mask (21) facilitate removal of the uncovered portions of lower masking layer (16) during a subsequent etching step. (FIGS. 22–23).

The method further includes etching the lower masking layer (16) through the openings in the second photoresist mask (21). Etching lower masking layer (16) exposes the underlying portions of the surface of insulating layer (5). The etching step further includes removing distal portions of the lower masking layer (16) not covered by second photoresist mask (21).

Subsequent to removal of lower masking layer (16), the method includes depositing a cathode layer (2) on the surface of photoresist mask (21) and the exposed portions of insulating layer (5). Deposition of cathode layer can be performed in any manner as discussed herein above. For example, cathode layer (2) may include a cladded cathode layer.

Deposition of cathode layer (2) provides contact with the distal ends of each lateral resistor (20) in the regions not covered by photoresist mask (21). In addition, cathode layer (2) extends between an end of each lateral resistor (20) proximate the lift-off pillar (8) and corresponding portions of lift-off pillar (8). The cathode layer (2) does not contact the central portion of each lateral resister (20) that is covered by photoresist mask (21).

Figure 24:
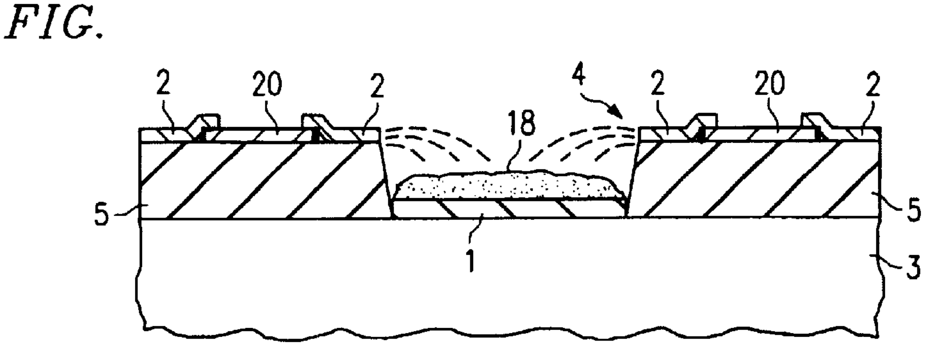
Figure 25:
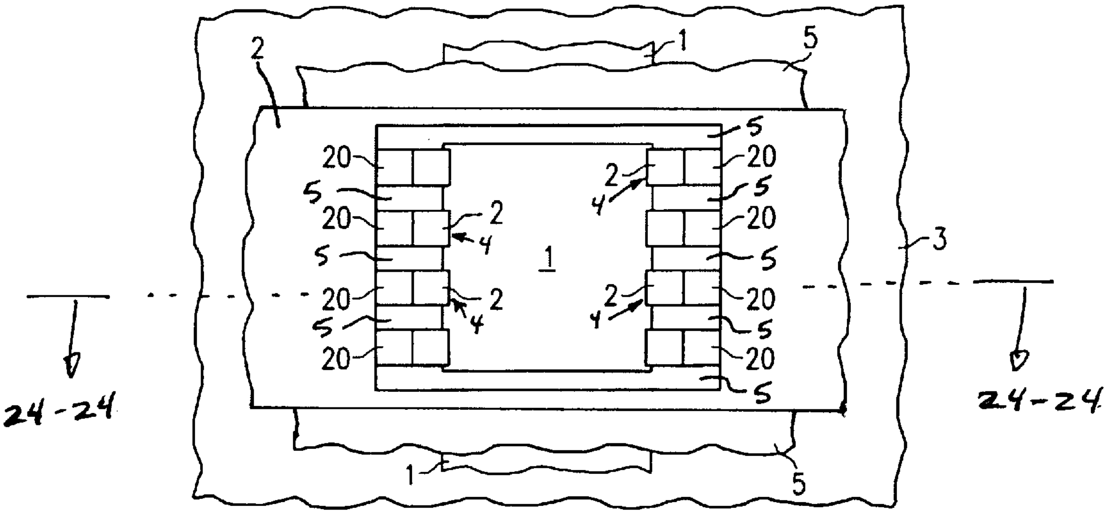

In a next step, the method includes etching the photoresist mask (21), the portion of cathode layer (2) overlying and coating photoresist mask (21), and the remaining portions of lower masking layer (16) covered by photoresist mask (21). Subsequently, lift-off pillar (8) is removed by etching to create the opening in insulating layer (5) and to expose the underlying anode layer (1), as shown in FIGS. 24 and 25. Note that FIG. 24 illustrates a cross-sectional view of the structure taken along line 24–24 of FIG. 25. FIG. 25 illustrates a top view of the structure.

Subsequent to removal of lift-off pillar (8), the method includes undercutting insulating layer (5) by etching under cathode layer (2), and more particularly, the edges (4) of the comb-shaped cathode layer (2). The edges (4) of the comb-shaped cathode layer (2) are located around the perimeter of the opening in insulating layer (5). Etching the insulating layer (5) is carried out for a prescribed duration sufficient to produce a desired undercut from the cathode layer (2).

The method may further include depositing a phosphor layer (18) in the well formed by the opening in cathode layer (2) and insulating layer (5). More particularly, the phosphor layer (18) is formed on the surface of anode layer (1) in the region of the well, as shown in FIG. 24.

Figure 26:
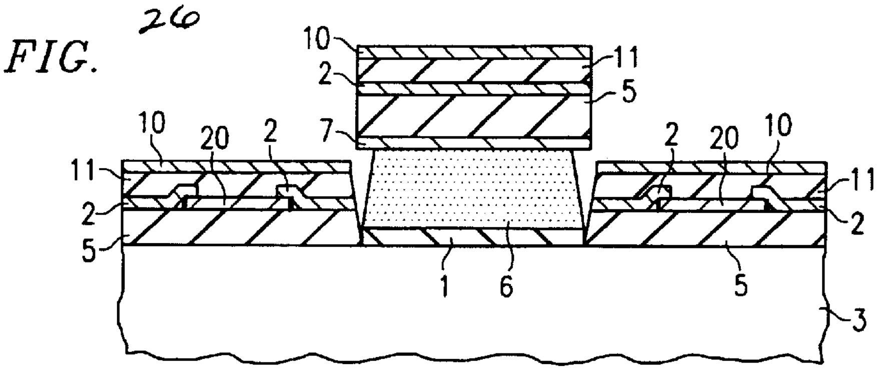
FIGS. 26–27 illustrate processing steps of depositing a second insulating layer and second conducting layer according to another embodiment.
Figure 27:
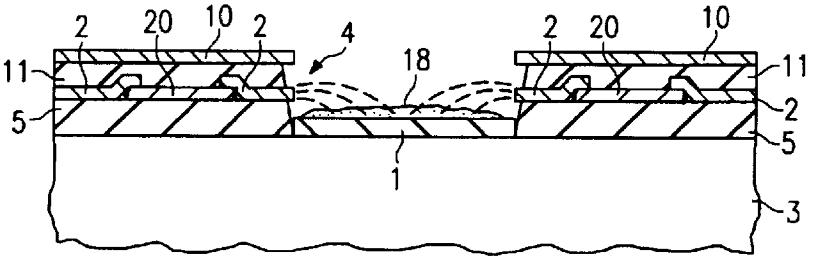

A still further embodiment of the method of the present disclosure is shown in FIGS. 26–27, beginning with the structure as formed up to that as shown in FIGS. 22 and 23, and subsequent to removal of the second photoresist mask (21) and lower masking layer (16).

The method further includes depositing a second insulating layer (11) on exposed portions of first insulating layer (5), the top surface of cathode layer (2) located above lift-off pillar (8) and regions of cathode layer (2) not above lift-off pillar (8), and on the surface of lateral resistors (20). A conductive layer (10) is subsequently deposited on the surface of the second insulating layer (11).

The method further includes removing lift-off pillar (8) by etching. Removing lift-off pillar (8) creates an opening in layers (10), (11), (2) and (5), and thereby exposes the surface of the anode layer (1) in the region of the opening.

Subsequent to removal of lift-off pillar (8), the method includes undercutting insulating layers (5) and (11) by etching under cathode layer (2) and conductive layer (10), respectively. Etching the insulating layers (5) and (11) is carried out for a prescribed duration sufficient to produce a desired undercut from the cathode layer (2) and conductive layer (10), respectively (FIG. 27). The undercut includes the edges (4) of the comb-shaped cathode layer (2). The edges (4) of the comb-shaped cathode layer (2) are located around the perimeter of the opening in insulating layer (5).

The method still further may include depositing a phosphor layer (18) in the well formed by the opening in conductive layer (10), insulating layer (11), cathode layer (2), and insulating layer (5). More particularly, the phosphor layer (18) is formed on the surface of anode layer (1) in the region of the well, as shown in FIG. 27.

The embodiment as shown in FIG. 27 includes a field emission device that forms a triode device having a comb-shaped emitter layer (2) and lateral resistors at the base of each comb. In addition, a gate or control layer (10) is positioned above cathode layer (2).

Figure 28:
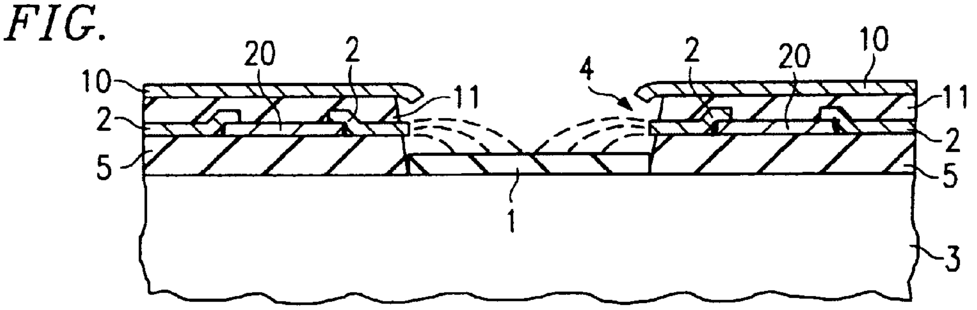
FIG. 28 shows a cross-sectional view of an edge formed in the second conducting layer and bent towards the emitting layer according to another embodiment of the present disclosure.

In a further embodiment, as shown in FIG. 28, the method further comprises forming the second conductive layer (10) with two layers of metal. That is, conductive layer (10) is formed of two conductive materials, a lower level material having a coefficient of linear expansion smaller than that of the upper level material. Accordingly, conductive layer (10) is caused to bend by its formation through deposition of the two conductive materials and thermal processing. Accordingly, an edge portion of the second conductive layer (10) proximate the opening will bend down toward emitting edge (4) of cathode layer (2).

Figure 29:
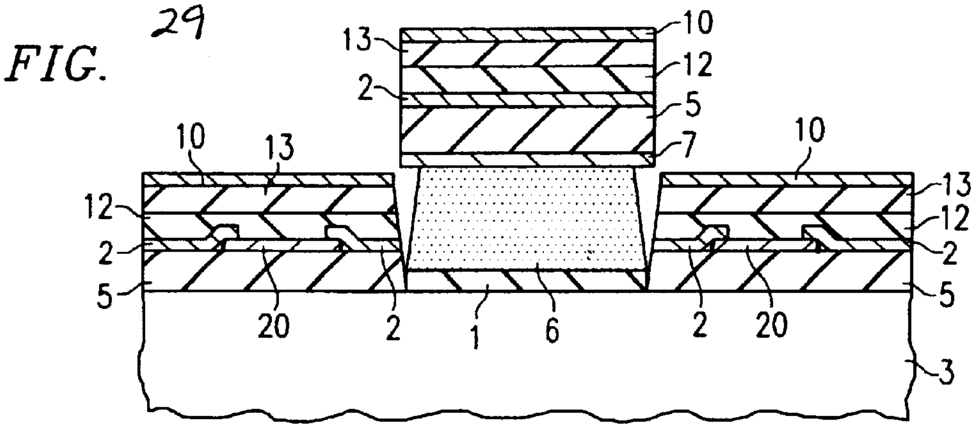
FIGS. 29 and 30 illustrate an embodiment of the present disclosure including providing a second dielectric layer with materials having different etch rates for bending an edge of a second conducting layer towards the emitting layer.
Figure 30:
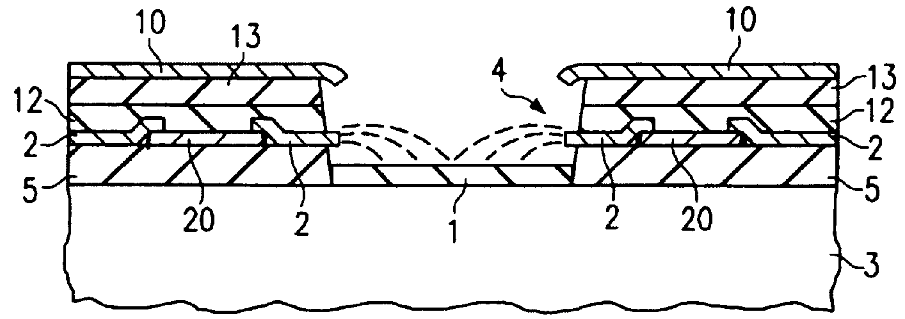

Another embodiment of the method of the present disclosure includes depositing and bending the second conductive layer (10) towards cathode layer (2) as shown in FIGS. 29 and 30. In FIG. 29, second insulating layer (11) is formed by depositing upper and lower layers (13,12) of insulating materials. The upper material layer (13) is selected for its greater rate of etching compared to that of lower material layer (12). In addition, second conductive layer (10) is deposited as two material layers, the bottom layer having a smaller coefficient of linear expansion than the top layer, such that upon subsequent etching and thermal processing, an edge of the second conductive layer proximate the opening will bend down toward emitting edge (4) of cathode layer (2).

The method further includes removing lift-off pillar (8) by etching. Removing lift-off pillar (8) creates an opening in layers (10), (11), (2) and (5), and thereby exposes the surface of the anode layer (1) in the region of the opening.

Subsequent to removal of lift-off pillar (8), the method includes undercutting insulating layers (5) and (11) by etching under cathode layer (2) and conductive layer (10), respectively. Etching the insulating layers (5) and (11) is carried out for a prescribed duration sufficient to produce a desired undercut from the cathode layer (2) and conductive layer (10), respectively (FIG. 30). The undercut includes the edge (4) of the cathode layer (2) located around the perimeter of the opening in insulating layer (5).

With respect to undercutting conductive layer (10), the upper material layer (13) of second insulating layer (11) is etched until the edge of the second conductive layer bends a desired amount towards lower material layer (12) of second insulating layer (11) and the edge (4) of the cathode layer (2).

In the embodiment shown in FIG. 30, the second conducting layer (10) may include Cr and the cathode layer (2) may include C, Cr—C—Cr, or any other cathode as discussed herein above. The cathodes for the embodiment of FIG. 30 may also be made in a comb-shape, and/or a comb-shape with lateral resistors, similarly, as discussed herein above.

Figure 31:
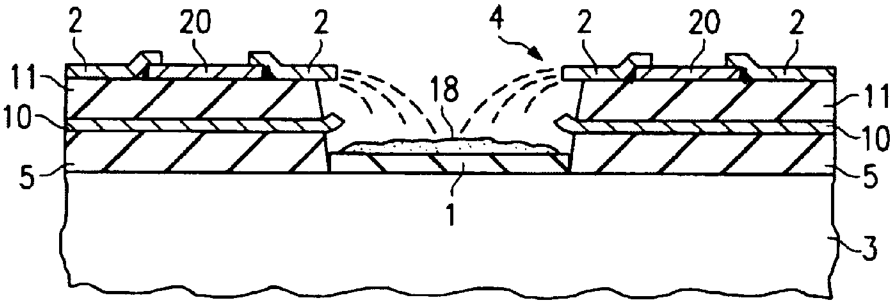
FIG. 31 illustrates a further embodiment of the present disclosure including forming a lateral resistor in a comb-shaped cathode line having an emitting edge and bending an edge of a second conductive layer up towards the emitting edge of the cathode layer.

FIG. 31 shows a cross-sectional view of a field emission device made according to yet a further embodiment of the method of the present disclosure. The field emission device of FIG. 31 includes comb-shaped cathode lines of cathode layer (2) having lateral resistors (20), wherein an emission current of the cathode lines is controlled by second conductive layer (10).

In the embodiment of FIG. 31, the second conductive layer (10) is formed from a bottom material layer and an upper material layer. The upper material layer is selected to have a smaller coefficient of linear expansion than that of the lower material layer. Accordingly, upon deposition and subsequent thermal processing, the edge of conductive layer (10) proximate the opening in insulating layer (5) will bend up toward emitting edge (4) of cathode layer (2). Materials for the lower and upper material layers of the second conductive layer (10) may include, for example, C and Cr, respectively.

Figure 32:
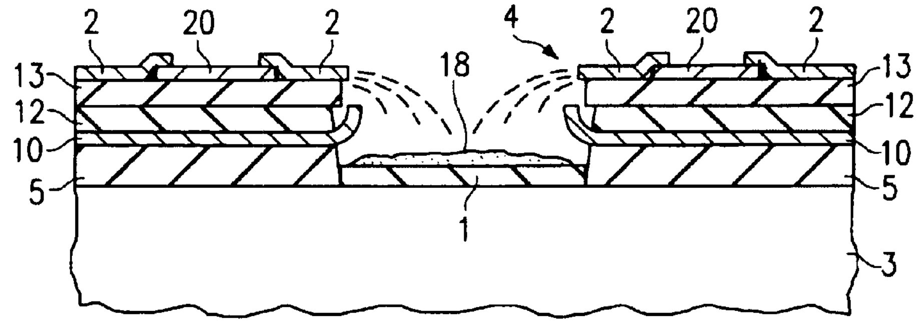
FIG. 32 illustrates another embodiment of the present disclosure including providing a second dielectric layer with materials having different etch rates for bending an edge of a second conducting layer towards the emitting layer.

FIG. 32 shows another field emission device produced by the method according to yet another embodiment of the present disclosure. In the device of FIG. 32, the lower material layer (12) and upper material layer (13) are successively deposited to form second insulating layer (11). Lower material layer (12) is selected to have a faster etch rate than that of upper material layer (13). A further example of the material combinations which may be used includes $SiO_2$ for lower material layer (12) and $Si_3N_4$ for upper material layer (13).

Figure 33:
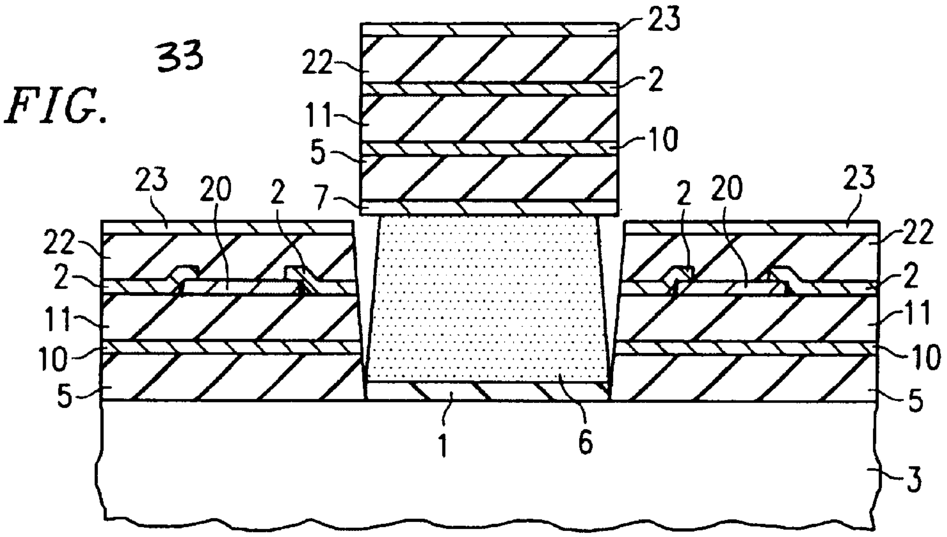
FIGS. 33–34 illustrate another embodiment of the present disclosure, including the formation of third insulating and conducting layers.
Figure 34:
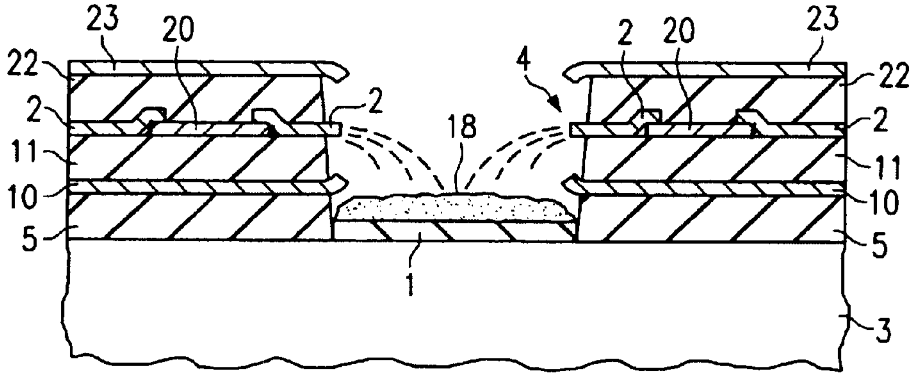

FIGS. 33 and 34 show another field emission device produced by the method according to still another embodiment of the present disclosure. In the device of FIGS. 33 and 34, a third insulating layer (22) and a third conducting layer (23) are deposited following deposition of cathode layer (2). Lift-off pillar (8) is then etched in a similar manner as discussed herein above with respect to the other embodiments, and insulating layers (5), (11) and (22) are undercut to expose conductive edges, also similarly as discussed herein above.

In the device structure of FIG. 34 thus formed, second conducting layer (10) and third conducting layer (23) may be biased positively with respect to cathode layer (2). Biasing of second conducting layer (10) and third conducting layer (23) serves to control the emission from cathode layer (2), wherein cathode layer (2) is negatively biased with respect to anode (1) during emission.

In the structure of FIGS. 33 and 34, the second conducting layer (10) and third conducting layer (23) can include, Mo, for example. Insulating layers (5), (11) and (22) can include $SiO_2$. The method according to still further embodiments includes forming comb-shaped emitters in cathode layer (2) and bending second conducting layer (10) and third conducting layer (23) towards cathode layer (2). In addition, materials for second conducting layer (10) and third conducting layer (23), may also include, for example, carbon-chromium (C—Cr) and chromium-carbon (Cr—C), respectively.

Figure 35:
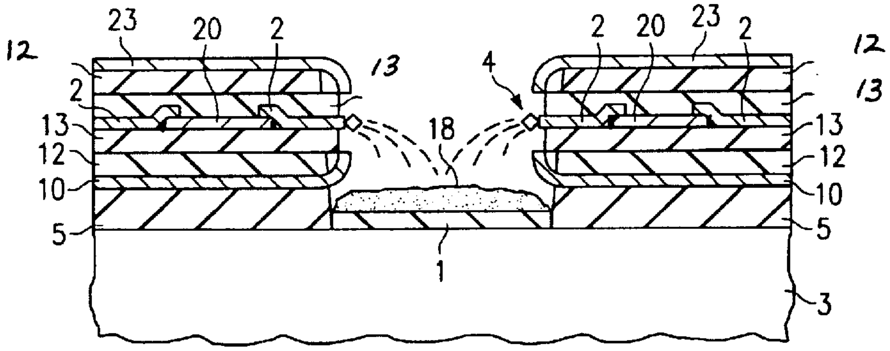
FIG. 35 illustrates another embodiment of the present disclosure including providing second and third dielectric layers with materials having different etch rates for bending an edge of the second and third conducting layers towards the emitting layer.

FIG. 35 shows a field emission device made by the method according to a further embodiment of the present disclosure. Insulating layer (11) of FIG. 34 is formed by an insulating material layer (13) disposed on top of an insulating material layer (12), the material layer (13) being selected to have a slower etch rate than material layer (12), wherein etching of insulating layer (11) causes second conducting layer (10) to bend towards cathode layer (2). In addition, insulating layer (22) of FIG. 34 is formed by an insulating layer (12) disposed on top of an insulating layer (13), layer (13) being selected to have a slower etch rate than layer (12), wherein etching of insulating layer (22) causes third conducting layer (23) to bend towards cathode layer (2).

With reference still to FIG. 35, the edge (4) of cathode layer (2) may include diamond, the diamond having been disposed upon the edge using a technique as discussed herein above. In addition, lateral resistors 20 are provided in cathode layer 2.

Lastly, the method further includes depositing a phosphor layer (18) in the well formed by the opening in the insulating layer (5), second conductive layer (10), insulating layers (12,13), cathode layer (2), insulating layers (13,12), and third conductive layer (23). More particularly, the phosphor layer (18) is formed on the surface of anode layer (1) in the region of the well, as shown in FIG. 35.

Referring now to FIGS. 36–41, the method of fabricating a field emission device according to another embodiment herein includes photolithography and lift-off processing. The method begins by providing a substrate (3) having a conductive layer disposed on a surface thereof. Substrate (3) may include a glass substrate and the conductive layer may include chromium-aluminum-chromium, for example.

Figure 36:
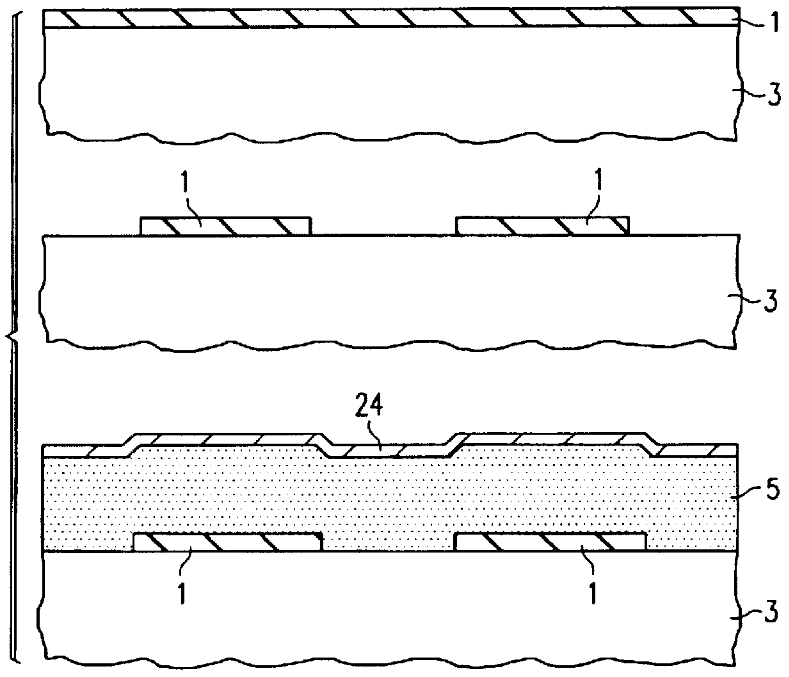

The conductive layer is patterned to serve as an anode (1). In addition, a first insulating layer (5) is disposed upon the surface of substrate (3) and anode (1), followed by deposition of a lower masking layer (24) on the first insulating layer (5), as shown in FIG. 36. Lower masking layer (24) may comprise aluminum, for example.

Figure 37:
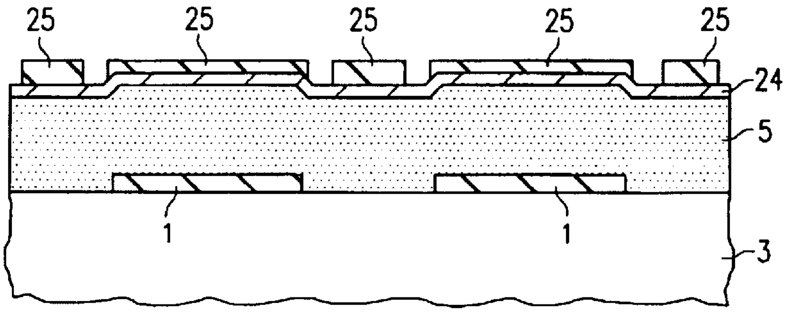

In FIG. 37, the method continues with the deposition of a photoresist layer on the lower masking layer (24). A photoresist mask (25) is formed through patterning and etching of the photoresist layer, as shown in FIG. 37, using photolithography steps known in the art. The photoresist mask (25) defines at least one or more regions for subsequently formed resistors (26), as further discussed herein below.

The lower masking layer (24) is then etched through photoresist mask (25), uncovering corresponding portions of first insulating layer (5). The method further includes depositing a resistive layer upon the surface of photoresist mask (25) and the exposed areas of first insulating layer (5), as shown in FIG. 38. The resistive layer may include SiC and the deposition method may include magnetic sputtering, for example.

The method subsequently includes etching to remove photoresist mask (25) and lower mask layer (24), furthermore to expose the surface of insulating layer (5), and to form resistors (26). Subsequent to removal of photoresist mask (25) and lower mask layer (24), the method includes depositing another lower masking layer (27) on the surface of first insulating layer (5) and resistors (26). Lower masking layer (27) includes aluminum, for example. The method further includes depositing photoresist layer (28) on the surface of lower masking layer (27), as shown in FIG. 39. Still further, the method includes forming a mask, aligned with resistors (26) and anodes (1), by patterning and etching photoresist layer (28) using photolithography steps, as known in the art.

The method further includes etching lower masking layer (27) according to the pattern of photoresist mask (28) to expose first insulating layer (5) and opposite end portions of resistors (26). Subsequent to etching lower masking layer (27), cathode layer (2) is deposited on the surfaces of the photoresist mask, exposed first insulating layer (5) and opposite end portions of resistors (26), as shown in FIG. 40.

The method continues with the removal of the photoresist mask (28) and lower mask layer (27) to expose part of first insulating layer (5) overlying anodes (1). Removal of the photoresist mask (28) and lower mask layer (27) furthermore forms cathode edge (4) of cathode layer (2), wherein the cathode layer (2) is aligned with resistors (26), as shown in FIG. 41. Removal of the photoresist mask (28) and lower mask layer (27) is accomplished via lift-off processing.

In a next step, the exposed surface of insulating layer (5) is etched to create window-like openings of respective field emission devices. Etching of insulating layer (5) exposes the conductive surface of respective anodes (1) in the well-like structures formed by removal of insulating layer (5) above the anode (1).

Exemplary materials for anode (1) include Cr—Al—Cr. Exemplary materials for first insulating layer (5) include $SiO_2$. An exemplary material for lower masking layer (27) is Al, which may be deposited by the CVD method, as may first insulating layer (5). An exemplary material for resistive layer (26) is SiC. An exemplary material for cathode layer (2) is Cr—ZrC—Cr.

Figure 42:
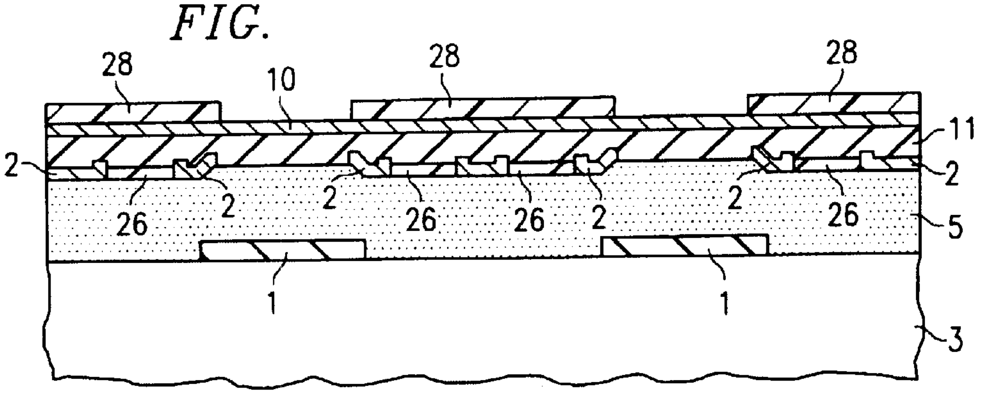
Figure 43:
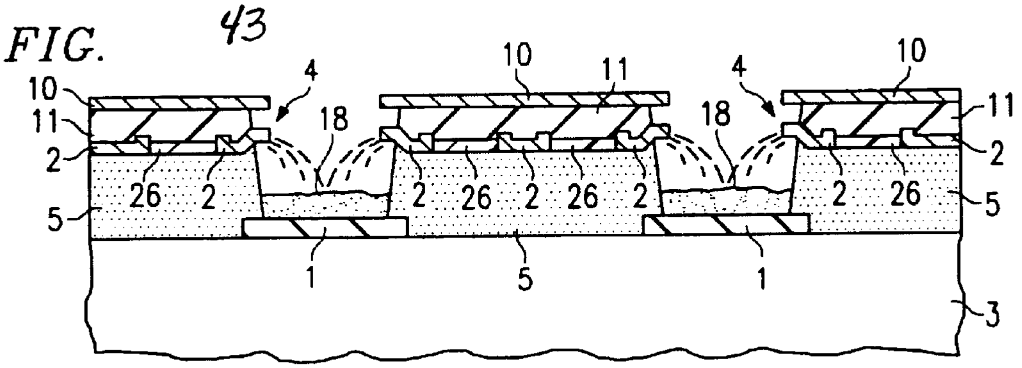

A further embodiment of the method of the present disclosure, as shown in FIGS. 42 and 43, comprises the above-mentioned steps up until forming of cathode edges (4), but prior to etching the exposed surface of insulating layer (5), as shown in FIG. 41. The method includes the further steps of depositing a second insulating layer (11) on the surface of first insulating layer (5), cathode layer (2) and resistors (26), depositing a second conducting layer (10) on the surface of the second insulating layer (11), and forming a photoresist mask (28) aligned with edge (4) of cathode layer (2). Exemplary materials for second conducting layer (10) include Ni, Cr, and NiCr.

The method further includes successively etching second conducting layer (10), second insulating layer (11) and first insulating layer (5) to create the window-like opening of respective field emission devices. Etching of the layers also exposes the conductive surface of anodes (1) in the well-like structures formed by removal of the layers above the anodes (1). Subsequent to formation of the well-like structures, the method may further include depositing a phosphor layer (18) on the conductive surface of anodes (1) (FIG. 43).

Figure 44:
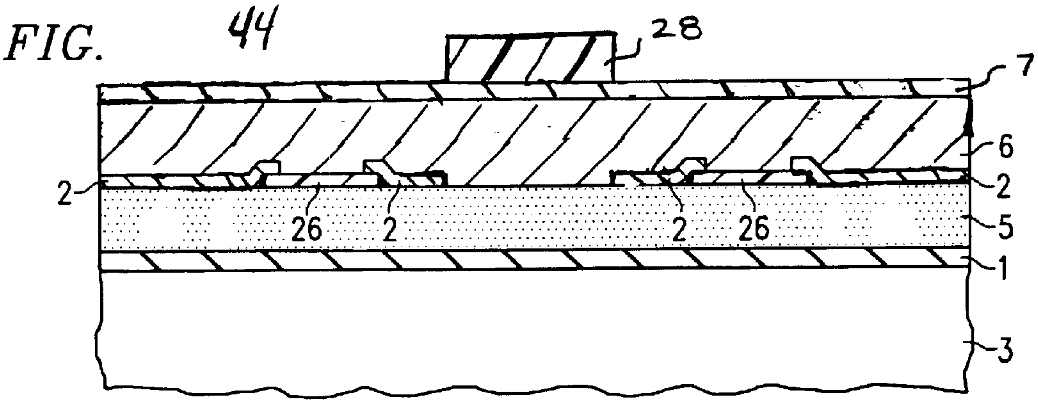
FIGS. 44–48 illustrate a process according to another embodiment of the present disclosure using direct photolithography and lift-off processing.

A further embodiment of the method of the present disclosure, shown in FIGS. 44–48, includes the foregoing steps as described herein above with reference to FIGS. 36–41, up to formation of cathode edges (4), and in which the method includes the following further steps. The method includes depositing a first lift-off layer (6) and lift-off cap layer (7) on the surfaces of first insulating layer (5), cathode layer (2) and resistors (26), as shown in FIG. 44.

Figure 45:
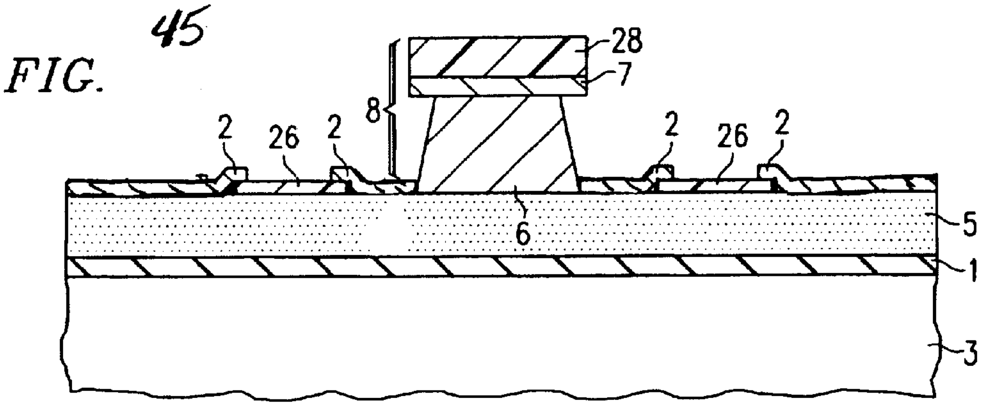

A photoresist mask (28) is formed on lift-off cap layer (7) by photolithography. The photoresist mask (28) overlies lift-off cap layer (7) in the region of anode (1). In a next step, the two lift-off layers (6,7) are etched through photoresist mask (28) to expose the surfaces of cathode layer (2) and resistors (26). In addition, etching of the two masking layers creates liftoff pillar (8) above the desired region of anode layer (1). The method further includes undercutting lift-off layer (6) by etching, as shown in FIG. 45.

Figure 46:
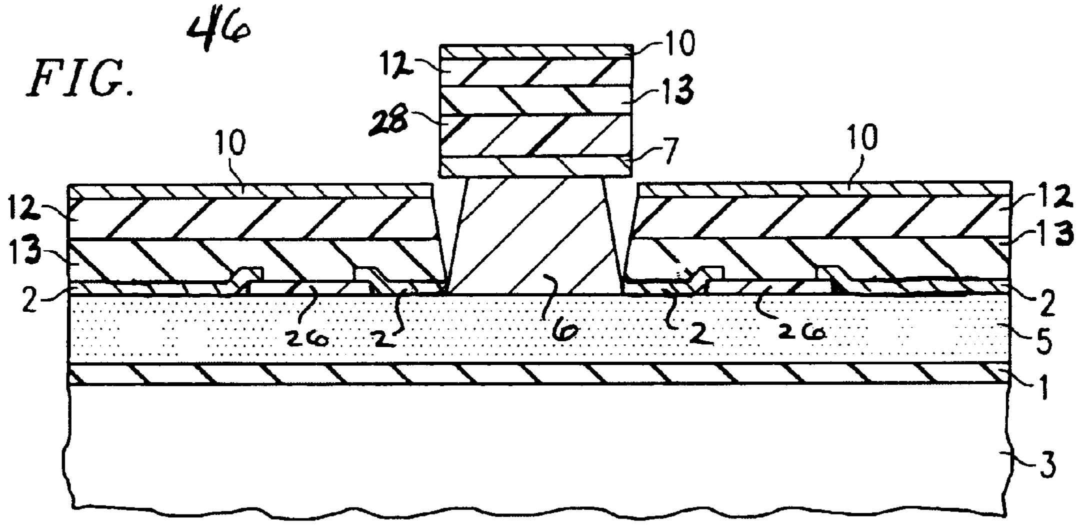
Figure 48:
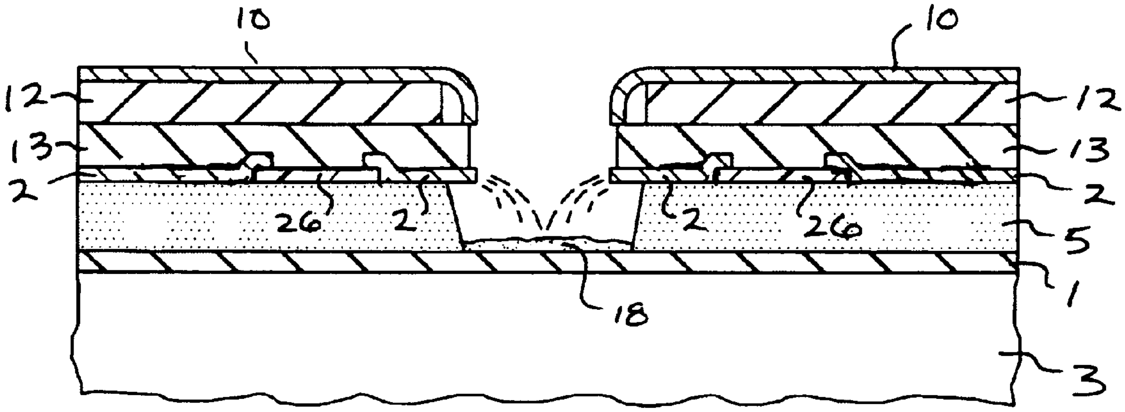

In FIG. 46, the method further includes depositing a second insulating layer (11) having upper insulating layer (12) and lower insulating layer (13) on the surfaces of lift-off pillar (8), cathode layer (2) and resistors (26). In the structure of FIG. 46, the upper insulating layer (12) is selected to have a faster etch rate than that of lower insulating layer (13), wherein etching of insulating layer (11) causes a second conducting layer (10) to bend towards cathode layer (2) as shown in FIG. 48.

The method further includes depositing second conductive layer (10) as shown in FIG. 46. The second conductive layer (10) comprises two conductive layers, wherein the bottom layer has a smaller coefficient of linear expansion than the top layer.

Figure 47:
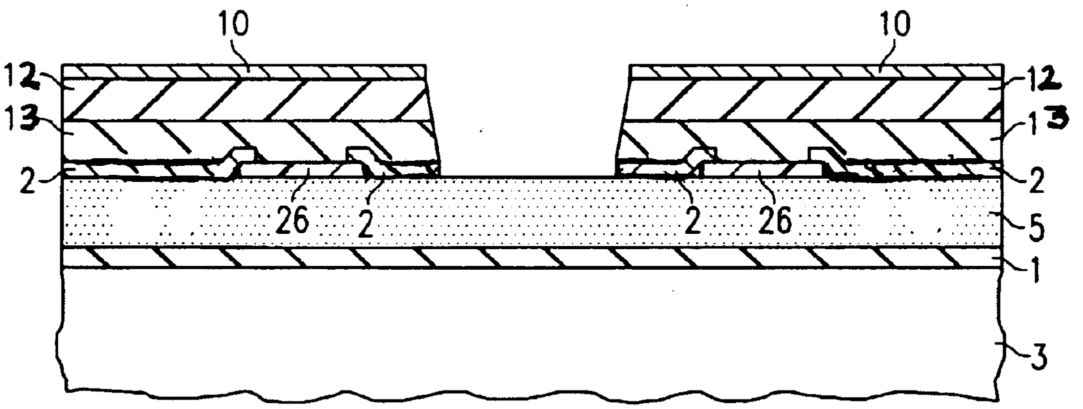

Subsequent to formation of second conducting layer (10), the method continues with the step of removing lift-off pillar (8) to create a portion of the window-like opening of the device and also expose the surface of first insulating layer (5), as shown in FIG. 47. Removing lift-off pillar (8) can be accomplished by etching.

The method further includes etching first insulating layer (5) to create a remaining portion of the window-like opening of the device in first insulating layer (5) and to expose the conductive surface of anode (1). Subsequent to etching of first insulating layer (5), upper insulating layer (12) of second insulating layer (11) is undercut until the edge of second conducting layer (10) bends towards cathode layer (2). Second conducting layer (10) may also touch lower insulating layer (13), as shown in FIG. 48.

The method may further include optionally depositing a material with negative affinity or low work function on edge (4) of cathode layer (2), wherein the edge (4) faces into the window of the field emission device. Depositing the negative electron affinity material can be accomplished, for example, through an electrophoretic deposition method. Electrophoretic deposition includes supplying a voltage between edge (4) and shorted anode (1) while the device is immersed in a bath containing the negative electron affinity material, and then baking the device.

The method may still further include optionally depositing phosphor layer (18) in the well created by the window-like opening of the device. More particularly, the phosphor layer (18) is formed on the surface of anode (1) in the region of the well, as shown in FIG. 48.

With respect to those field emission devices fabricated through the foregoing methods that include depositing a phosphor layer in the well-like structure of the device, the resulting devices can be used to create respective display elements. The phosphor particles of such display elements are to have a diameter smaller than the distance from the anode layer (1) to the cathode layer (2) of a respective device, otherwise shorting could occur.

Numerous commercial phosphor materials are available for potential use in field emission devices fabricated according to the embodiments of the present disclosure. These phosphor materials may be deposited in any one of several ways. In one embodiment, phosphor layer (18) is deposited by ink jet printing. In another embodiment, phosphor layer (18) is deposited through screen printing or mask deposition.

In a further embodiment, phosphor layer (18) is deposited through electrophoretic deposition, in which a solution containing phosphor particles is placed in a bath, the device is immersed in the bath, and a voltage is supplied between cathode line (2) and anode line (1). All anode lines corresponding to a particular color of phosphor may be shorted together during deposition of the particular color. The device may also be placed in as many baths as there are color phosphors for successive depositions. During a given deposition, a shorting bar can be placed across electrical contact leads of respective anode lines for the given color, for example, to short the respective anode lines.

Thin films of phosphor layer (18) may also be deposited on anode layer (1) during device fabrication. In another embodiment of the present disclosure, the method includes depositing a thin-film phosphor layer (18) on anode layer (1) immediately following fabrication of the anode layer (1), and includes providing a protective coating layer over the top of phosphor layer (18). The protective layer serves to protect the phosphor material from subsequent process steps. In this embodiment, the protective layer would subsequently be etched away at the end of the device fabrication process.

Field emission devices, fabricated through the foregoing embodiments of the method of the present disclosure, may also be used as cathode sources for a wide range of applications, including applications other than flat panel displays. For example, the applications may include cathode sources for other displays such as vacuum fluorescent displays (VFDs) and cathode ray tubes (CRTs), and cathode sources for lamps, instruments, machinery or lasers. The field emission device structure fabricated according to one embodiment of the present disclosure, as shown in FIG. 9, is one such general cathode source.

Field emission device structures, fabricated according to certain of the various embodiments of the method disclosed herein, can be configured as needed to increase the current level of respective device structures. That is, the method includes configuring the device according to the requirements of a particular application.

Figure 49:
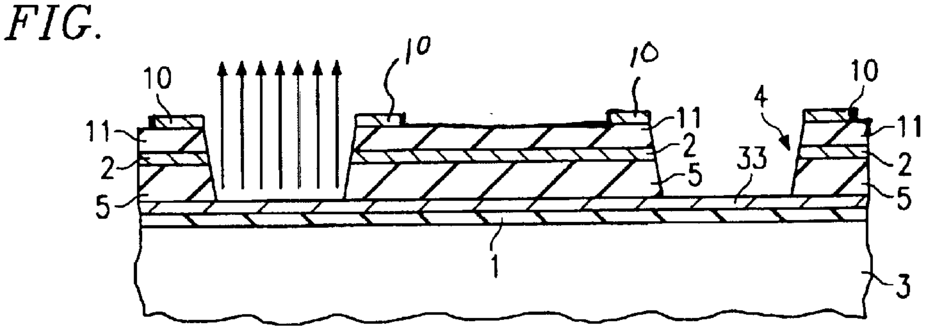
FIGS. 49 and 50 depict side and top views of a field emission device produced by the method according to one embodiment of the present disclosure, the method including disposing a layer of material having a high degree of secondary electron emission onto the anode layer.
Figure 50:
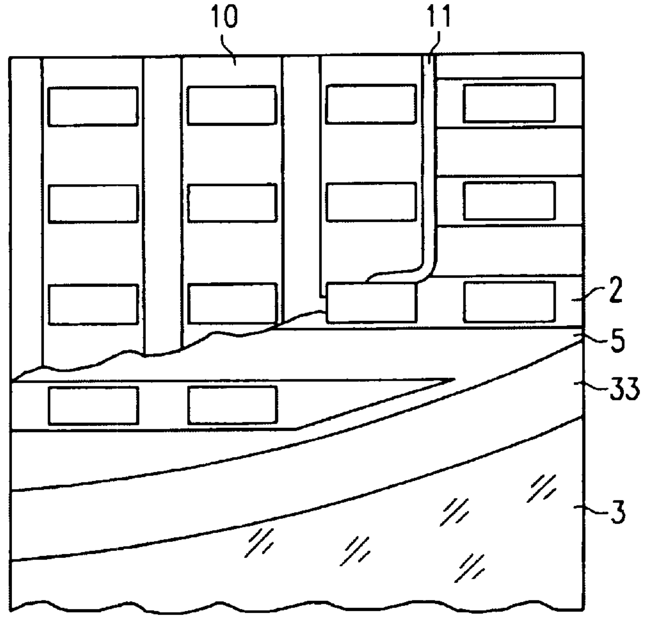

One such embodiment of configuring a field emission device structure is shown in FIGS. 49 and 50, showing side and top views of the device structure, respectively. The device of FIGS. 49 and 50 is fabricated according to one embodiment of the method of the present disclosure in which a layer of material having a high degree of secondary electron emission (33) is disposed on anode layer (1). Secondary emission layer (33) may be deposited on the anode layer (1) by sputtering or other suitable process. Deposition of secondary emission layer (33) occurs immediately following fabrication of the anode layer and before any of the subsequent process steps described in the various embodiments above.

In addition, a protective layer may be formed on secondary emission layer (33) to prevent degradation of secondary electron emission from the respective layer as a result of patterning of the respective layer or subsequent process steps. Many materials exhibit high ratios of secondary electron emission and may be used. Exemplary materials include, for example, diamond, MgO, $Al_2O_3$, and BaO.

In a further embodiment of the method of the present disclosure, secondary electron emission layer (33) may be deposited into the well-like structure of the device formed by anode layer (1) and the window-like opening in insulating and conductive layers of the field emission device structure. That is, deposition of secondary electron emission layer (33) may occur after the respective device has been fabricated.

Figure 51:
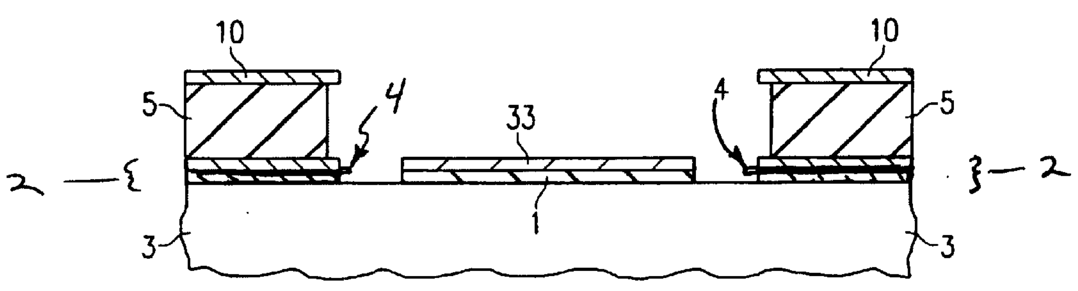
FIG. 51 illustrates a field emission device produced by the method of the present disclosure according to another embodiment, wherein the device substrate serves as the insulating layer between a cathode layer and an anode layer having a secondary electron emission layer disposed on a surface of the anode layer.

In a still further embodiment of the method of the present disclosure, substrate (3) serves as the insulating layer, wherein anode layer (1) and secondary electron emission layer (33) are patterned so as to be at a prescribed distance away from cathode layer (2), as shown in FIG. 51. In this embodiment, the method also includes forming cathode layer (2) directly on substrate (3).

In yet another embodiment of the method of the present disclosure, secondary electron emission layer (33) may be deposited first on anode layer (1) and then again on the uppermost surface of the device, as shown in FIG. 52. Deposition of secondary electron emission layer (33) preferably occurs after the rest of the device has been completed, so as to substantially continuously cover the entire surface of the field emission device.

The use of secondary electron emission layer (33), according to the embodiments of the present disclosure, provides one of several design elements in the fabrication of a field emission device. The design elements of secondary electron emission layer (33) allows considerable flexibility in determining the degree and location of current emitted from the field emission device during device operation.

Another design element includes varying a thickness of emitter edge (4). A thinner edge increases the coefficient of enhancement of electric field, as described by the Fowler-Nordheim formula, and thereby increases a current level to be emitted from the field emission device. The application of negative electron affinity materials to emitter edge (4), the roughening of the surface of the cladded metal-carbon-metal cathode layer (2), and the formation of comb-shaped or tooth-shaped emitters at emitter edge (4), as described above in the various embodiments, constitute other design elements in determining a level of current to be emitted from the field emission device.

A further such design element includes selecting a size or shape of the window-like openings of the device so as to increase or decrease a length of emitter edge (4) and/or selecting its location over the surface of the field emission device. For example, this design element can be implemented in the embodiments that use lift-off processing, as discussed herein, further including changing a mask pattern for the lift-off pillars according to the desired design element. This is possible since all other insulating and conducting layers are self-aligning to respective lift-off pillars.

By way of example, FIG. 53 depicts a top view of a field emission device formed by the lift-off method according to one embodiment of the present disclosure. The lift-off pillars were patterned in the shape of long strips. The method for fabricating the field emission device also includes patterning emitter edge (4) to contain a tooth-shaped pattern.

As a further example, FIG. 54 shows a field emission device in which the lift-off pillars are patterned in a shape suitable for use in a character/segmented display, such as a vacuum fluorescent display (VFD). In another embodiment of the method of the present disclosure, cathode layer (2) may be flexibly configured by combining two or more of the foregoing design elements so that the current emitted by the field emission device fabricated by one or more of the various embodiments of the method of the present disclosure may be fabricated at desired levels and locations, suitable for a given field emission device application.

In addition to the various embodiments discussed above, the method may further include fabricating the field emission device with the inclusion of a getter and placing of the field emission device within a vacuum envelope. In particular, the getter is included within the vacuum envelope of the field emission device to absorb gaseous contaminants. Preferably, the getter is included in a sufficient amount so as to create a high ratio of getter surface area to vacuum volume. Furthermore, various embodiments of the method of the present disclosure can be modified, as appropriate, to provide a thin-film gettering solution for the fabricated field emission devices, as may be necessary. Exemplary getter materials include alloys, nitrides and oxides of Zr, Fe, Ta, Ba, Si, V and Ni. Porous forms of materials such as Si or Al can also be used.

Figure 55:
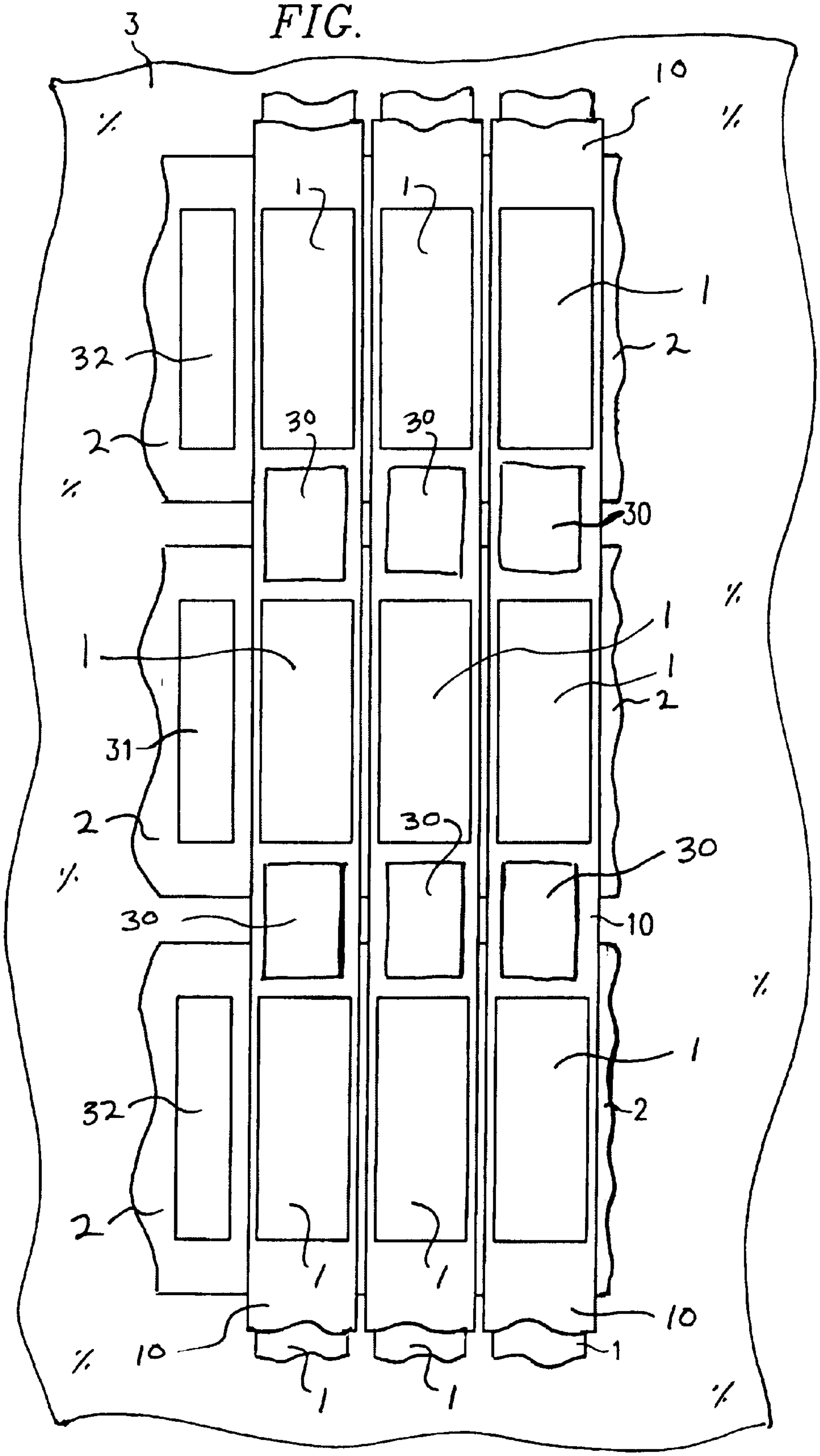
FIG. 55 shows a top view of a field emission device formed by the method of the present disclosure according to another embodiment, including depositing a getter on a top surface of the device.

According to one embodiment of the method of the present disclosure, a topmost conducting layer of the field emission device is made partly or entirely of a conductive getter material. In another embodiment of the method of the present disclosure, the method includes depositing a conductive getter (30), through mask deposition or another suitable method, onto a top of the uppermost conductive surface of a fabricated field emission device, such as shown in FIG. 55. In a still further embodiment of the method of the present disclosure, the method includes depositing a non-conductive getter (31) onto an uppermost insulating surface of the field emission device (FIG. 55). In either of the two foregoing embodiments, to increase the exposed surface area of the getter and allow better communication of gaseous contaminants to the getter, the method further includes forming a small spacer (32) on the uppermost surface of the device (FIG. 55).

In another embodiment, the spacer can also be made of a getter material. In a yet another further embodiment, all or part of one or more of the insulating layers of the device may be made of a non-conducting getter material, thus making the getter part of the well wall of the device.

In a still further embodiment, an opening in insulating and conducting layers of the device may be patterned with direct lithography or lift-off processing, and the getter deposited in the corresponding opening. For example, if the field emission devices formed part of a display device, the method could include the formation of a "fourth well" for every subpixel triad of the display. The getter could then be deposited in the fourth well. A further advantage of this embodiment would include the continuous activation of the getter by the operation of the device.

In the foregoing embodiments, the method further includes activating the getter materials before or after sealing of a respective device. Activation of the getter materials can be accomplished through at least one of thermal treatment and application of electrical current.

According to yet another embodiment, the method includes vacuum sealing the field emission device. Vacuum sealing enables the fabricated devices to operate upon application of appropriate voltage potentials to the anode, cathode, and control electrode of a respective device. In one embodiment, the method includes placing an unpatterned sheet of glass, or other transparent material capable of withstanding temperatures of 450° C., over the uppermost surface of the field emission device, placing a sealing layer of frit material around the perimeter of the device, heating the frit material until it softens, lowering the glass until it bonds with the frit material, allowing the device to cool and then pumping down the envelope thus formed to a vacuum level of $10^{-6}$ Torr or greater.

A further embodiment of the method includes introducing both the field emission device, with frit material placed around the perimeter, and a top glass into a chamber with a vacuum level maintained at $10^{-6}$ Torr or greater, elevating the temperature in the chamber, lowering the top glass onto the device, and heating the frit area further with a quartz lamp, laser or other heat source, so as to form the frit bond between the top glass and the device. In a still further embodiment, the method includes depositing getter material onto the top glass, the getter material configured for being included within the sealed device.

A further embodiment of the method of the present disclosure includes fabricating a vacuum microelectronic device (VMD) using a pre-formed first insulating layer. This embodiment of the method may further simplify the fabrication process by allowing the use of purchased or easily fabricated materials to replace certain fabrication steps, discussed herein above.

In one embodiment of the method including pre-formed first insulating layer, a substrate is provided on which are patterned anode lines and a first dielectric layer having the window-like openings of the device. Such substrates are widely used in the plasma display industry, and are commonly referred to as "barrier rib glass."

The substrates having anode lines and a first dielectric layer can be fabricated in one of several ways. The substrate may include, for example, soda lime glass. Anode lines can be patterned on the substrate, followed by screen printing and baking of successive layers of frit material until desired barrier ribs, or walls, are formed. The barrier ribs provide a well-like or channel-like structure into which may be deposited a phosphor layer. Common dimensions of the walls are on the order of 250 $\mu$m in height by 25 $\mu$m in width, although a wide variety of other dimensions are possible. Other methods of forming the well-like openings include the use of sand-blasting, etching, photo-patternable glass and tapes of photo-patternable dielectric materials.

Further in connection with the embodiment of using a pre-formed insulating layer and substrate, a second transparent substrate is patterned with the conductive and additional insulating layers of the field emission device. The two substrates are then aligned and vacuum sealed to form a vacuum sealed field emission device. For example, patterning of the second substrate may include forming a second conducting layer thereon, the second conducting layer to serve as a control electrode, a second dielectric layer and then a cathode layer. At least one of direct photolithography and lift-off processing may be used in the forming of the second conducting layer, the second dielectric layer, and the cathode layer.

Upon joining the second substrate to the first provided substrate, a device, such as shown in FIG. 50 can be formed, having a top transparent sealing layer (not shown) already in place. Getters may also be formed on the uppermost layer of the device, as part of one of the insulating layers or on top of the walls of the first insulating layer.

One example use of field emission devices formed by the various embodiments disclosed herein includes a large flat panel display. For example, the large flat panel display may be on the order of 30 inches or more on the diagonal, and can be fabricated at a substantially lower cost than plasma display panels.

Figure 56:
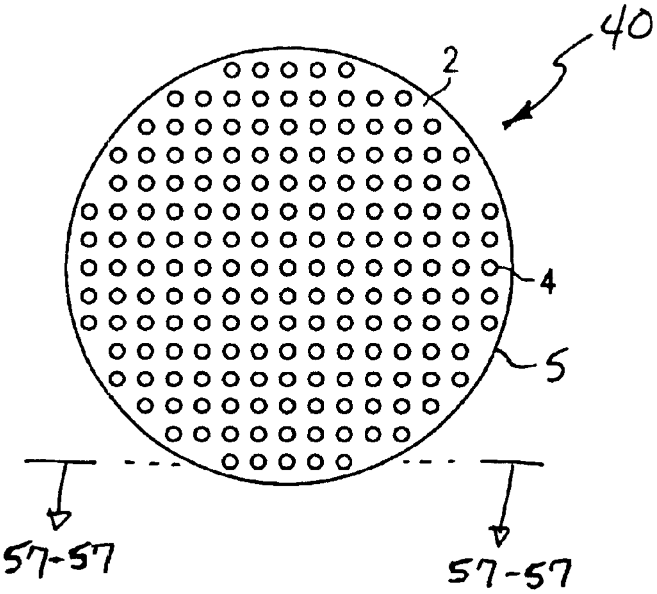
FIG. 56 shows a top view of an example microchannel plate used in the method of the present disclosure according to another embodiment.
Figure 57:
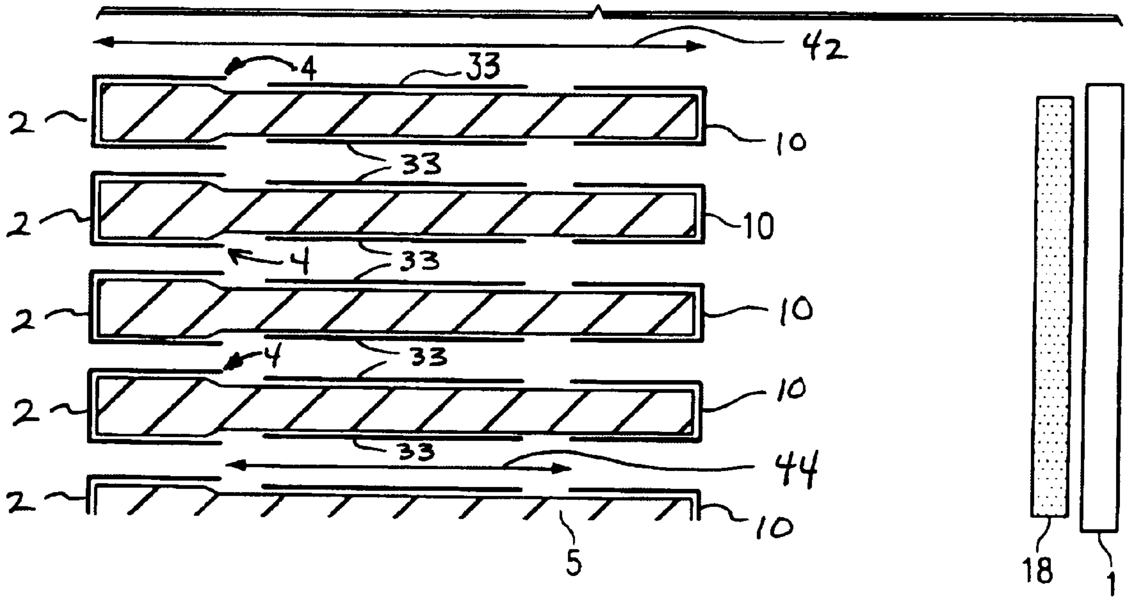
FIG. 57 shows a side view of a field emission device formed by the method of the present disclosure, using the microchannel plate of FIG. 56 as an insulating layer.

In a further embodiment of the method of the present disclosure, a microchannel plate formed of an insulating material, such as glass or ceramics, is provided. Such microchannel plates are commonly used in the fabrication of light amplifying devices and have a high density of small channel openings. FIG. 56 shows a top view of such a microchannel plate 40. Using standard deposition processes with no additional patterning processes, cathode layer (2) may be deposited on the top of first insulating layer (5), as shown in FIG. 57. Emitting edge (4) is formed slightly inside the openings in first insulating layer (5). Microchannel plate 40 may have a thickness dimension in the range on the order of 100–500 $\mu$m, as indicated by reference numeral 42 in FIG. 57.

Plasma dry etching from the opposite side of insulating layer 5 will help to sharpen emitting edge (4). In addition, rotating the microchannel plate during deposition enhances coverage and uniformity of cathode layer (2). The microchannel plate 40 having cathode layer (2) deposited upon a top surface thereof may then be directly coupled to an anode plate (1) with a phosphor coating (18). Alternatively, the microchannel plate (40) can be, operated with an anode plate (1) having a phosphor layer (18) placed some distance away, as shown in FIG. 57.

In a further embodiment of the method of the present disclosure, a second conducting layer to serve as a control electrode (10) is deposited on the opposite side of first insulating layer (5) from cathode layer (2), as shown in FIG. 57. Control electrode 10 may be spaced from edge (4) of cathode layer (2) by a distance on the order of 10–300 $\mu$m, as indicated by reference numeral 44. In still another embodiment, cathode layer (2) is deposited on one side of first insulating layer (5), followed by a second insulating layer and then a second conductive layer to serve as a control electrode.

In another embodiment, a secondary emission layer (33) is deposited inside the microchannels, as shown in FIG. 57, prior to deposition of cathode layer (2). The high density of openings and the relatively large surface of secondary electron emission material along the sides of the openings enables very high current values from the device.

According to one method of the present disclosure, a novel edge emitter device is provided having an anode and a cathode. A window-like opening is provided above the anode. The cathode is situated at a level above and laterally displaced from the anode proximate the opening. An emitting edge of the cathode is operable to emit field electrons in response to application of a positive voltage to the anode with respect to the cathode.

The method further includes disposing at least one of a phosphor and a layer of secondary emission material on a top surface of the anode. The phosphor layer is operable to luminesce when struck with the electrons emitted from the emitting edge of the cathode. The secondary emission material is characterized as having a higher secondary emission ratio than that of the anode.

The method of the present disclosure can further provide a device capable of being configured as a diode, triode, tetrode, etc., the device having one or more control electrodes to control the current from the emitting edge of the cathode to the anode.

The method yet further includes a fabrication process capable of automatic alignment of the cathode above an insulating layer and proximate the window opening above anode. The fabrication process also provides a self-alignment of the emitter edge as a protrusion of the cathode extending slightly beyond the insulating layer and into the window-like opening.

The various embodiments of the present disclosure provide a novel type of cold cathode structure including a thin-film edge emitter facing into a vacuum space. In one embodiment, the method includes forming a sheet or ribbon cathode layer on an insulating layer having gap(s) in the shape of a well, hole, or channel. The edge of the cathode layer faces into the vacuum space formed by the gap(s), through which electrical current can flow to an anode. The anode may be placed below the cathode, above the cathode on a further dielectric layer, or on a separate substrate distanced from the cathode substrate.

Layers of material having a high degree of secondary emission, disposed on layers of conductive material, may be placed below the cathode, or above the cathode, on a further dielectric layer. The gap(s) may be configured so as to conform to a desired pattern of current discharge, such as in a character/segmented display having phosphor-coated anode lines arranged as characters or graphical segments. The emitter structure may further incorporate a ribbon-like gate layer, separated from the cathode layer by a further insulating layer, so as to lower a required switching voltage.

Numerous applications are possible for the configurable cold cathode structures fabricated according to one or more of the various embodiments of the method of the present disclosure. The applications include backlights, Vacuum Fluorscent Displays (VFDs), Cathode Ray Tubes (CRTs), flood CRTs, lamps, and non-display products. Additional applications include high speed switch/circuits, microwave amplifiers, high temperature and pressure electronics and sensors, vacuum crossbar switches, printer/laser drivers, photo-field emitters, micromirrors, and propulsion systems.

One advantage of the cathode structure of the present disclosure is the ability for a designer to easily configure the cathode to provide a desired current to a desired location. A very wide range of current levels are possible, from low current for VFD applications to high currents for specialty CRTs. The level and location of the current are controlled by variation of the cathode layer thickness, patterning of the cathode layer edge, use of secondary electron emission materials, spacing of the gaps and shaping of the gaps. For example, one configuration may include combining the embodiment of FIG. 49 (or FIG. 52) with the microchannel plate structure of FIG. 57, substituting the anode 1 of FIG. 57 with the embodiment of FIG. 49 (or FIG. 52), to produce a desired current amplification for a given application. Furthermore, the microchannel plate structure of FIG. 57 can also be coupled with any other thermal or cold cathode emitter structure for producing a desired high current device.

Additional advantages of the configurable cathode fabricated according to the various embodiments of the method of the present disclosure include one or more of: high reliability; high emission brightness and emission uniformity; low power consumption; little or no generated heat; moderate vacuum requirement; low sheet capacitance between cathode and gate layers; long lifetime; efficient use of generated current; ease of fabrication; and low environmental hazard.

Still further, the cathode structures exhibit emission uniformity across wide areas. The thin-film cathode can be deposited with uniform thickness, a key determinant of emission uniformity, using established deposition methods. The Cr—C—Cr cathodes for the emitter structures emit very stable current. Previous edge emitters made out of metal alone exhibited unacceptable degrees of migration and other non-uniformities. Carbon, however, has high resistance to ionization, low surface migration of atoms, chemical inertness, a high temperature of evaporation and other physical/chemical properties which make it an excellent emitter material.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clauses are intended to cover the structures described herein as performing the recited function and not only structural equivalents, but also equivalent structures.

What is claimed is:

1. A method for fabricating a thin-film edge emitter device comprising the steps of:

providing a first conductive layer having a top surface;

providing an insulating layer having a top surface disposed above the top surface of the first conductive layer;

providing a second conductive layer on the insulating layer; and providing a well in the insulating layer over the first conductive layer and an edge in the second conductive layer proximate the well, wherein providing the well and the edge includes processing the first conductive, insulating, and second conductive layers by at least one of lift-off processing, photolithography processing, and processing with the use of a pre-formed insulating layer having at least one opening associated with a location of the well, wherein the first conductive layer forms an anode and the second conductive layer forms at least one of a cladded cathode having an emissive edge and a control electrode.

2. The method of claim 1, wherein providing the first conductive layer further includes forming strips of the first conductive layer having a first orientation, providing the second conductive layer further includes forming strips of the second conductive layer having a second orientation, and providing the well and the edge further includes forming at least one well and at least one edge at an at least one location of an intersection of the first orientation with the second orientation.

3. The method of claim 1, wherein the cathode includes a cladded cathode of at least metal-carbon-metal.

4. The method of claim 3, wherein the metal includes at least chrome and the carbon includes at least one thin layer of carbon.

5. The method of claim 3, further comprising:

subsequent to providing the well and edge, preferentially etching the edge to expose a thin edge of at least one thin layer of carbon resulting from its protrusion slightly beyond the metal layers of the cladded cathode.

6. The method of claim 3, wherein the carbon of the cladded cathode is deposited by at least one of carbon arc deposition, phase vapor deposition, chemical vapor deposition, and laser ablation.

7. The method of claim 3, further comprising:

providing multiple sets of carbon rods during a deposition of the carbon in a deposition chamber for enhancing a deposition uniformity.

8. The method of claim 7, further comprising:

introducing amounts of gas into the deposition chamber to stimulate formation of carbon nanotubes.

9. The method of claim 3, wherein providing the second conductive layer includes forming the cladded cathode by depositing metal, depositing metal and carbon simultaneously, depositing carbon, depositing metal and carbon simultaneously, and depositing metal.

10. The method of claim 9, further comprising:

subsequent to providing the well and edge, etching the edge to expose a rough surface of carbon points above and below a central thin edge of carbon resulting from its protrusion slightly beyond the metal layers of the cladded cathode.

11. The method of claim 1, wherein the second conductive layer includes at least one of a material capable of emitting electrons under a high electric field and any combination of such materials.

12. The method of claim 11, wherein the material includes a negative electron affinity material including at least one of diamond, diamond-like carbon, carbon nanotubes, and nitrides.

13. The method of claim 1, further comprising:

subsequent to providing the well and edge, depositing nanoparticles of a material with negative electron affinity onto the edge.

14. The method of claim 13, wherein the material includes at least diamond.

15. The method of claim 13, wherein the nanoparticles include particles on the order of 30–60 Angstroms.

16. The method of claim 13, wherein depositing the nanoparticles includes electrophoretic deposition using a voltage supplied between the anode and the cathode.

17. The method of claim 13, further comprising:

thermally treating the nanoparticles at a temperature between 300 degrees Celsius and 650 degrees Celsius.

18. The method of claim 1, wherein the cathode includes a cladded cathode layer of chromium carbon chromium.

19. The method of claim 1, further comprising:

providing a vacuum space in the well.

20. The method of claim 1, wherein the first conductive layer includes at least a reflective material.

21. The method of claim 1, further comprising:

providing at least one of a phosphor and a material having a high ratio of secondary emission in the well.

22. The method of claim 21, wherein providing material having a high ratio of secondary emission includes forming a layer of secondary emission material upon the first conductive layer.

23. The method of claim 1, further comprising:

undercutting the insulating layer proximate the edge in the second conductive layer.

24. The method of claim 1, further comprising:

prior to providing the second conductive layer, providing at least one resistor on the insulating layer, the at least one resistor for coupling with the second conductive layer proximate the edge, the at least one resistor configured to stabilize an emission current of the device.

25. The method of claim 24, wherein the resistor includes at least one of SiC, high resistance diamond, amorphous Si, TaN, TiN, and other materials with resistance on the order of $10^5$–$10^9$ ohms/square.

26. The method of claim 1, further comprising:

prior to providing the well, providing at least one of an additional insulating layer and an additional conductive layer over the second conductive layer, wherein providing the well further includes providing the well in the at least one additional insulating layer and a second edge in the additional conductive layer.

27. The method of claim 26, further wherein the second conductive layer forms a cathode or a control electrode, and the additional conductive layer forms the other of the cathode or the control electrode.

28. The method of claim 26, still further comprising:

subsequent to providing the at least one additional insulating layer and additional conductive layer, providing another at least one of an additional insulating layer and an additional conductive layer, wherein providing the well further includes providing the well in the another at least one additional insulating layer and a third edge in the another additional conductive layer, wherein the another additional conductive layer forms a control electrode.

29. The method of claim 28, wherein the field emission device includes at least one of a diode, a triode and a tetrode.

30. The method of claim 26, wherein providing the well further includes undercutting the first and additional insulating layers proximate the edges in the second and additional conductive layers, respectively.

31. The method of claim 26, further comprising:

bending at least one of the edges of the second conductive layer and the additional conductive layer in a direction of other edge.

32. The method of claim 31, wherein the at least one additional insulating layer includes a bottom insulating layer and a top insulating layer, the bottom insulating layer having an etch rate characteristic different from an etch rate characteristic of the top insulating layer, wherein the bottom and top insulating layers are configured to provide a desired bending of the at least one of the edges of the second and additional conductive layers.

33. The method of claim 32, wherein the bottom and top insulating layers include at least one of silicon oxide, aluminum oxide, silicon nitride.

34. The method of claim 31, further wherein at least one of the second conductive layer and the additional conductive layer includes a bottom conductive layer and a top conductive layer, the bottom conductive layer having a coefficient of linear expansion different from that of the top conductive layer, wherein the bottom and top conductive layers are configured to provide a desired bending of the at least one of the edges of the second and additional conductive layers.

35. The method of claim 26, further comprising:

prior to providing the additional conductive layer, providing at least one resistor on the additional insulating layer, the at least one resistor for coupling with the additional conductive layer proximate the second edge, the at least one resistor configured to stabilize an emission current of the device.

36. The method of claim 1, wherein providing the first conductive layer and providing the first insulating layer includes providing the first conductive layer on a surface and providing the insulating layer on the first conductive layer and the surface.

37. The method of claim 1, wherein providing the first conductive layer and providing the first insulating layer includes providing a first substrate of barrier rib glass.

38. The method of claim 1, wherein providing the first conductive layer and providing the first insulating layer includes providing at least one anode line and a first dielectric layer, respectively, on a first substrate, the first dielectric layer having at least one opening associated with a location of at least one well of the device.

39. The method of claim 38, further wherein providing the second conductive layer includes providing a second transparent substrate with at least a control electrode, a dielectric layer, and a cathode layer having at least one opening associated with the location of the at least one well of the device, the cathode layer including the edge; the method further comprising:

vacuum sealing the first substrate to the second substrate.

40. The method of claim 1, further comprising:

providing frit material around a perimeter of the device;

disposing a transparent substrate onto the device inside a vacuum chamber; and forming a frit bond between the transparent substrate and the device.

41. The method of claim 1, further comprising:

providing at least one of a conductive getter material in a topmost conductive layer, a conductive getter material on a topmost conductive surface, a non-conductive getter material in at least one insulating layer, a non-conductive getter material deposited on a topmost insulating layer, and a getter material in an opening provided in at least one of a conductive layer and an insulating layer, wherein the getter material is configured to absorb gaseous contaminants within a vacuum envelope of the device.

42. The method of claim 1, further comprising:

providing at least one of getter material on a surface of the device and getter material in a surface of the device, wherein the getter material is configured to absorb gaseous contaminants within a vacuum envelope of the device.

43. The method of claim 1, wherein the well includes a shape suitable for use in at least one of a character display and a segmented display.

44. The method of claim 1, wherein the well includes a patterned shape configured to define a configuration of the edge.

45. The method of claim 44, wherein the patterned shape includes at least one of a segmented character shape, a comb shape, and a saw-tooth shape.

46. The method of claim 1, wherein forming the well includes lift-off processing, the method further comprising:

prior to providing the insulating layer, forming a lift-off pillar over the first conductive layer, wherein providing the insulating layer further includes depositing the insulation layer over at least the lift-off pillar and the surface; and subsequent to providing the second conductive layer, removing the lift-off pillar to form the well in the insulating layer over the first conductive layer and form the edge in the second conductive layer proximate the well.

47. The method of claim 46, wherein removing the lift-off pillar further includes undercutting the insulating layer proximate the edge in the second conductive layer.

48. The method of claim 46, further comprising:

prior to forming the second conductive layer, forming at least one resistor on the insulating layer, the at least one resistor for coupling with the second conductive layer proximate the edge, the at least one resistor configured to stabilize an emission current of the device.

49. The method of claim 48, wherein the resistor includes at least one of SiC, high resistance diamond, amorphous Si, TaN, TiN, and other materials with resistance on the order of $10^5$–$10^9$ ohms/square.

50. The method of claim 46, further comprising:

prior to providing the second conductive layer, forming at least one of a mask and a lift-off cap over the lift-off pillar and the insulating layer, the at least one of the mask and lift-off cap patterned according to a desired edge configuration, wherein removing the lift-off pillar further forms the edge according to the desired edge configuration.

51. The method of claim 50, wherein the desired edge configuration includes at least one of a segmented character shape, a comb shape and a saw tooth shape.

52. The method of claim 46, further comprising:

subsequent to forming the lift-off pillar and prior to removing the lift-off pillar, providing at least one of an additional insulating layer and an additional conductive layer over the second conductive layer, wherein removing the lift-off pillar additionally includes forming the well in the at least one additional insulating layer and forming a second edge in the additional conductive layer.

53. The method of claim 52, wherein removing the lift-off pillar further includes undercutting the first and additional insulating layers proximate the edges in the second and additional conductive layers, respectively.

54. The method of claim 1, wherein forming the well includes photolithography processing, the method further comprising:

subsequent to providing the insulating layer and the second conductive layer, forming a photoresist mask over the second conductive layer, the photoresist mask patterned to have at least one opening associated with a location of the well; and etching the second conductive layer and the first insulating layer according to the patterned photoresist mask to form the well and the edge.

55. The method of claim 1, wherein providing the second conductive layer includes lift-off processing by forming at least one lift-off pillar prior to forming the second conductive layer, forming the second conductive layer, and removing the at least one lift-off pillar to form the second conductive layer with the edge, and wherein providing the well includes photolithography processing, said method further comprising:

prior to providing the well, providing at least one of an additional insulating layer and an additional conducting layer over the second conductive layer;

forming a photoresist mask over the at least one additional conducting layer, the photoresist mask patterned to have at least one opening associated with a location of the well; and etching the at least one additional conducting layer, the at least one additional insulating layer, the second conducting layer and the first insulating layer according to the patterned photoresist mask to form the well, the edge in the second conductive layer, and an additional edge in the additional conductive layer.

56. The method of claim 55, wherein providing the well further includes undercutting the insulating layer proximate the edge in the second conductive layer.

57. The method of claim 55, further comprising:

subsequent to providing the insulating layer and prior to providing the second conductive layer, providing at least one resistor on the insulating layer, wherein providing the at least one resistor includes lift-off processing, and wherein providing the second conductive layer includes coupling the second conductive layer to the at least one the resistor proximate the edge.

58. The method of claim 1, wherein providing the well includes photolithography processing, the method further comprising:

subsequent to providing the insulating layer and prior to providing the second conductive layer, providing at least one resistor on the insulating layer, wherein providing the at least one resistor includes at least one of photolithography processing and lift-off processing, further wherein providing the second conductive layer includes lift-off processing by forming at least one lift-off pillar prior to forming the second conductive layer, forming the second conductive layer, and removing the at least one lift-off pillar to form the second conductive layer with the edge, wherein the second conductive layer couples to the at least one resistor proximate the edge; and prior to providing the well, providing at least one of an additional insulating layer and an additional conducting layer over the at least one resistor and the second conductive layer;

forming a photoresist mask over the at least one additional conducting layer, the photoresist mask patterned to have at least one opening associated with a location of the well; and etching the at least one additional conducting layer, the at least one additional insulating layer, the second conducting layer and the first insulating layer according to the patterned photoresist mask to form the well, the edge in the second conductive layer, and an additional edge in the additional conductive layer.

59. The method of claim 58, wherein providing the well further includes undercutting the first and additional insulating layers proximate the edges in the second and additional conductive layers, respectively.

60. The method of claim 1, wherein providing the second conductive layer includes lift-off processing by forming at least one lift-off pillar prior to forming the second conductive layer, forming the second conductive layer, and removing the at least one lift-off pillar to form the second conductive layer with the edge, and wherein providing the well includes photolithography processing, said method further comprising:

prior to providing the well, providing at least one of an additional insulating layer and an additional conducting layer over the second conductive layer;

forming at least one additional lift-off pillar over the first insulating layer associated with a location of the well;

providing at least one additional insulating layer and at least one additional conductive layer over the second conductive layer and the at least one additional lift-off pillar;

removing the at least one additional lift-off pillar to form an opening in the at least one additional insulating layer and the at least one additional conductive layer, and to form an additional edge in the at least one additional conductive layer; and etching the first insulating layer according to the opening in the second conductive layer, the at least one additional insulating layer, and the at least one additional conducting layer to form the well.

61. The method of claim 1, wherein providing the well includes processing with the use of a pre-formed insulating layer having at least one opening associated with a location of the well, and wherein providing the insulating layer includes disposing the pre-formed insulating layer on the first conductive layer, and subsequent to providing the second conductive layer on the insulating layer, removing the second conductive layer in the location of the well to form the edge.

62. The method of claim 1, wherein providing the well includes processing with the use of a pre-formed insulating layer having at least one opening associated with a location of the well, and wherein providing the insulating layer and providing the second conductive layer further includes:

forming the second conductive layer on a first surface of the pre-formed insulating layer and removing the second conductive layer in the location of the well to form the edge prior to disposing a second surface of the pre-formed insulating layer on the first conductive layer.

63. The method of claim 62, wherein the preformed insulating layer includes a microchannel plate.

64. The method of claim 62, wherein the preformed insulating layer further includes a secondary emission material disposed inside the at least one opening.

65. The method of claim 1, wherein forming the well includes processing with the use of a pre-formed insulating layer having at least one opening associated with a location of the well, and wherein providing the insulating layer and providing the second conductive layer further includes:

forming the second conductive layer and the edge on a first surface of the pre-formed insulating layer and forming an additional conductive layer and a corresponding additional conductive layer edge on an opposite surface of the pre-formed insulating layer, and disposing the opposite surface of the pre-formed insulating layer proximate the first conductive layer.

66. The method of claim 65, further comprising:

prior to disposing the pre-formed insulating layer proximate the first conductive layer, depositing a phosphor layer upon the first conductive layer.

* * * * *